(12) United States Patent
Hsu et al.

(10) Patent No.: US 8,153,906 B2
(45) Date of Patent: Apr. 10, 2012

(54) INTERCONNECTION STRUCTURE FOR IMPROVING SIGNAL INTEGRITY

(76) Inventors: Hsiuan-ju Hsu, Ping-tung (TW); Richard Walter Ziolkowski, Tucson, AZ (US)

(*) Notice: Subject to any disclaimer, the term of this patent is extended or adjusted under 35 U.S.C. 154(b) by 1147 days.

(21) Appl. No.: 11/986,323

(22) Filed: Nov. 20, 2007

(65) Prior Publication Data
US 2008/0169125 A1    Jul. 17, 2008

(51) Int. Cl.
*H05K 1/11* (2006.01)
(52) U.S. Cl. .......................... 174/262; 361/794
(58) Field of Classification Search .......... 174/262, 174/263–266; 361/792–795
See application file for complete search history.

(56) References Cited

U.S. PATENT DOCUMENTS

| | | | |
|---|---|---|---|
| 2002/0017399 A1* | 2/2002 | Chang et al. | 174/262 |
| 2002/0153167 A1* | 10/2002 | Miller | 174/261 |
| 2007/0124930 A1* | 6/2007 | Cheng et al. | 29/852 |

FOREIGN PATENT DOCUMENTS

| | | |
|---|---|---|
| TW | 95117616 | 5/2006 |
| TW | 95126133 | 7/2006 |

* cited by examiner

*Primary Examiner* — Jeremy Norris

(57) ABSTRACT

The embodiment of the invention is about a novel interconnection structure which can be incorporated into a variety of connectors, as well as other types of interconnections in order to reduce crosstalk, to improve signal integrity and to achieve EM emission compliance. A 4-via (2 signal vias, 1 power via, and 1 ground via) interconnection structure was used for demonstrating the effect of the novel interconnection structure. The same concept can be applied to any multi-via and multi-layer interconnection structure such as PCB, IC packaging circuit, or die circuit. Vias that have an electrical property can be added adjacent to the basic 4-via interconnection structure to achieve a multi-via interconnection structure. For 1-via (1 signal via or 1 power via), 2-via (1 signal via and 1 ground via or 1 signal via and 1 power via) and 3-via (1 signal via, 1 ground via, and 1 power via) interconnection structure, the proposed interconnection structure based upon the same concept can be applied as well.

14 Claims, 22 Drawing Sheets

INTERCONNECTION STRUCTURE FOR IMPROVING SIGNAL INTEGRITY

CROSS REFERENCE TO RELATED APPLICATIONS

The invention relates to an application that is entitled "A Novel Via Structure for Improving Signal Integrity," (application Ser. No. 11/651,338), which is filed presently with the U.S. Patent & Trademark Office, and which is used herein for reference in its entirety.

FIELD OF THE INVENTION

The embodiments of this invention relate to interconnection and in particular to a novel interconnection structure for improving the signal integrity and reducing the EMC/EMI problem. The novel interconnection structure can be incorporated into a variety of connectors, as well as other types of multi-layer circuit board, IC packaging circuit, or die circuit.

BACKGROUND

The invention is the extension of the presently filed patent "A novel via structure for improving signal integrity", which specifies the method of the improvement of signal integrity in multilayer circuit board. (application Ser. No. 11/651,338). The application of the invention is focused mainly on the combination of multilayer circuit boards by using connectors or any types of interconnection structures.

For the integration of multilayer printed circuit boards (PCB), integrated circuit packages, and integrated circuits on dies, there are many situations in which signals need to switch from circuit board to circuit board. Therefore, a good interconnection structure is needed for the improvement of the signal integrity of the whole system. Typically, a multi-pin connector or IC packaging circuit will be used to connect the signals of two circuit boards. The multi-pin connector connects a PCB to a PCB; the IC packaging circuit connects the die circuit to the PCB.

FIG. 5 to FIG. 20 show four prior situations of interconnection structures. FIG. 5 to FIG. 8 show the first prior interconnection structure. Two signal traces 60, 62 on the top layer of the top PCB 51 switch to the signal traces 61, 63 on the bottom layer of the bottom PCB 52 through the signal vias 70, 71, respectively. The signals propagating along via 70, 71 will pass through the two metal planes 54 and 56 on the top PCB 51, the metal frame 75 of the interconnection structure 53, and the two metal planes 55 and 57 on the bottom PCB 52. The metal planes on both PCBs can be either power planes or ground planes. The metal frame 75 of the interconnection structure 53 will connect electrically to the metal planes on both PCBs 51, 52 through the ground via (or power via) 69. When the signals propagate through via 70, 71, they will generate electromagnetic (EM) waves. The EM waves will not penetrate through the two ground vias (or power vias) 64 and 66 on the top PCB 51, the two ground vias (or power vias) 65 and 67 on the bottom PCB 52 and the metal frame 75 of the interconnection structure 53. However, the EM waves will leak from the junctions of the two PCBs 51, 52 and of the interconnection structure 53 due to the discontinuity between the two ground vias (or power vias) 64 and 66 on the PCBs 51, 52 and the metal frame 75 of the interconnection structure 53. The leakage of the EM waves will degrade the signal integrity. Also, the impedances of the signals propagating in the vias on the PCBs will be different from that of the signals propagating in the vias of the interconnection structure. This is the so-called impedance discontinuity. This impedance discontinuity will affect the signal quality as well. The ground via (or power via) 69 connects electrically to the ground planes (or power planes) on both PCBs and the metal frame 75 of the interconnection structure 53. It provides a current return path for the signals. However, the current return path is not the shortest current return path for the signals. Therefore, it will improve the signal integrity only a little.

FIG. 9 to FIG. 12 show the second prior interconnection structure. Two signal traces 119, 122 on the top layer of the top PCB 110 switch to the signal traces 121, 124 on the bottom layer of the bottom PCB 111 through the signal vias 120, 123, respectively. The signals propagating along vias 120, 123 will pass through the two metal planes 113 and 115 on the top PCB 110, the metal frame 130 of the interconnection structure 112, and the two metal planes 114 and 116 on the bottom PCB 111. The metal planes on both PCBs can be either a power plane or ground plane. The metal frame of the interconnection structure connects electrically to the metal planes on both PCBs through the ground via (or power via) 126. When the signals propagate through the signal vias 120, 123, they will generate electromagnetic (EM) waves. Due to the lack of ground vias or power vias surrounding the signal vias on the PCBs, the EM waves will propagate between the two metal planes 113 and 115 on the top PCB 110 and the two metal planes 114 and 116 on the bottom PCB 111. The EM waves propagating between metal planes will cause voltage fluctuations that will degrade the signal integrity. Also, the EM waves will leak from the junctions of the two PCBs 110, 111 and the interconnection structure 112. The leakage of the EM waves will degrade the signal integrity. Again, the impedance of the signals propagating in the vias on the PCBs will be different from that of the signal propagating in the vias of the interconnection structure. This is the so-called impedance discontinuity. This impedance discontinuity will affect the signal quality as well. The ground via (or power via) 126 connects electrically to the ground planes (or power planes) on both PCBs 110, 111 and the metal frame 130 of the interconnection structure 112. It provides a current return path for the signals. Again, it will improve the signal integrity only a little because the current return path is not the shortest current return path for the signals.

FIG. 13 to FIG. 16 show the third prior interconnection structure. Two signal traces 160, 163 on the top layer of the top PCB 151 switch to the signal traces 162, 165 on the bottom layer of the bottom PCB 152 through the signal vias 161, 164, respectively. The signals propagating along vias 161, 164 will pass through the two metal planes 154 and 156 on the top PCB 151, the metal frame 172 of the interconnection structure 153, and the two metal planes 155 and 157 on the bottom PCB 152. The metal planes on both PCBs can be either power planes or ground planes. The metal frame 172 of the interconnection structure 153 does not connect electrically to the metal planes on both PCBs. When the signals propagate through vias 161, 164, they will generate electromagnetic (EM) waves. Due to the lack of ground vias (or power vias) surrounding the signal vias on the PCBs, the EM waves will propagate between the two metal planes 154 and 156 on the top PCB 151 and the two metal planes 155 and 157 on the bottom PCB 152. The EM waves propagating between metal planes will cause voltage fluctuations that will degrade the signal integrity. Also, the EM waves will leak from the junctions of the two PCBs 151, 152 and of the interconnection structure 153. The leakage of the EM waves will degrade the signal integrity. Also, the impedance of the signals propagating in the vias on the PCBs will be different from that of the signals propagating in the vias of the interconnection structure 153. This is the so-called impedance discontinuity. This impedance discontinuity will affect the signal quality as well. The ground via (or power via) 167 connects electrically to the ground planes (or power planes) on both PCBs but does not connect electrically to the metal frame 172 of the interconnection structure 153. Therefore, the ground via (or power via) 167 will only provide a long current return path for the signals. It will benefit the signal integrity very little.

FIG. 17 to FIG. 20 show the fourth prior interconnection structure. Two signal traces 210, 213 on the top layer of the top PCB 201 switch to the signal traces 212, 215 on the bottom layer of the bottom PCB 202 through the signal vias 211, 214, respectively. The signals propagating along vias 211, 214 will pass through the two metal planes 204 and 206 on the top PCB 201, the interconnection structure 203, and the two metal planes 205 and 207 on the bottom PCB 202. The metal planes on both PCBs can be either power planes or ground planes. There is no metal frame for the interconnection structure. When the signals propagate through via 211, 214, they will generate electromagnetic (EM) waves. Due to the lack of ground vias or power vias surrounding the signal vias on the PCBs, the EM waves will propagate between the two metal planes 204 and 206 on the top PCB 201 and the two metal planes 205 and 207 on the bottom PCB 202. The EM waves propagating between metal planes will cause voltage fluctuations that will degrade the signal integrity. Also, because there is no metal frame in the interconnection structure 203, the EM waves will propagate outward along the interconnection structure 203 and the EM waves will couple each other between signal vias easily. This coupling will increase the insertion losses of the signals. Also, the impedance of the signals propagating in the signal vias 211, 214 on the PCBs will be different from that of the signal propagating in the signal vias 211, 214 of the interconnection structure 203 due to the material difference between the PCB 201, 202 and the interconnection structure 203. This is the so-called impedance discontinuity. This impedance discontinuity will affect the signal quality as well. The ground via (or power via) 217 only connects electrically to the ground planes (or power planes) on both PCBs. It will provide a long current return path for the signals. It will benefit the signal integrity very little.

The coarse solid lines A1, A2 of FIGS. 21 and FIG. 22 show the simulated insertion losses ($S_{21}$ and $S_{43}$) of the signal paths indicated from FIG. 1 to FIG. 4 for the novel interconnection structure. The other dashed lines and thin solid lines of FIG. 21 and FIG. 22 show the simulated insertion losses ($S_{21}$ and $S_{43}$) of the signal paths indicated from FIG. 5 to FIG. 20 for the four prior interconnection structures. The insertion losses ($S_{21}$ and $S_{43}$) of the coarse solid lines A1, A2 are larger than those of the other dashed lines and thin solid lines. The smaller insertion loss values for the four prior interconnection structures indicate that there is more energy dissipated along the signal paths. These energy losses could be due to EM radiation, impedance discontinuity, dielectric loss, and so on.

The coarse solid lines A3, A4 of FIGS. 23 and FIG. 24 show the simulated insertion losses ($S_{31}$ and $S_{42}$) of the signal paths indicated from FIG. 1 to FIG. 4 for the novel interconnection structure. The other dashed lines and thin solid lines of FIG. 23 and FIG. 24 show the simulated insertion losses ($S_{31}$ and $S_{42}$) of the signal paths indicated from FIG. 5 to FIG. 20 for the four prior interconnection structures. The insertion losses ($S_{31}$ and $S_{42}$) of the coarse solid lines A3, A4 are smaller than those of the other dashed lines and thin solid lines. The smaller insertion loss values for the novel connectors indicate that there is less energy coupled between the signal paths.

SUMMARY

The embodiment of the invention is about a novel interconnection structure which can be incorporated into a variety of connectors, as well as other types of interconnections in order to reduce crosstalk, to improve signal integrity and to achieve EM emission compliance. A 4-via (2 signal vias, 1 power via, and 1 ground via) interconnection structure was used for demonstrating the effect of the novel interconnection structure. The same concept can be applied to any multi-via and multi-layer interconnection structure such as a PCB, IC packaging circuit, or die circuit. Vias that have an electrical property can be added adjacent to the basic 4-via interconnection structure to achieve a multi-via interconnection structure. For 1-via (1 signal via or 1 power via), 2-via (1 signal via and 1 ground via or 1 signal via and 1 power via) and 3-via (1 signal via, 1 ground via, and 1 power via) interconnection structure, the proposed interconnection structure based upon the same concept can be applied as well.

The 4-via interconnection structure contains three main electrical concepts: impedance control, capacitor, and differential signaling. They are described as below: Impedance control (see FIG. 1 to FIG. 4): Two signal vias are connected to the signal traces on the top of the top circuit board and the signal traces on the bottom of the bottom circuit board; 1 ground via and 1 power via are connected with the ground planes and power planes on both circuits board, respectively. The signal vias connect the transmission lines that lie on the signal layers of the circuit boards. Two methods will be used to isolate the signal vias: One is the use of the metal frame; the other is the use of surrounding vias (metal walls). A metal frame is implemented between vias in the interconnection structure. When the ground via (or power via) is connected with the metal frame, the metal frame will become a ground metal frame (or power metal frame). The ground via (or power via) is connected with the metal frame to provide a reference plane for the signal vias. The ground metal frame (or power metal frame) is designed to be concentric to the signal vias. The ground metal frame (or power metal frame) needs to be kept a non-trivial distance from the signal vias to avoid shorting. The impedance of the signal vias can be properly designed by adjusting this distance between the signal via and the ground metal frame (or power metal frame). It is assumed that copper will be used for the ground metal frame (or power metal frame) in this implementation. The ground metal frame (or power metal frame) connects with the ground via (or power via) and the ground via (or power via) will connect with the ground planes (or power planes) of the circuit boards. Note that it is necessary that the ground planes (or power planes) on both circuit boards have the same electrical properties. With this configuration the signal vias can be isolated to prevent electromagnetic coupling with other vias in the interconnection structure. Also, the ground metal frame (or power metal frame) provides a voltage reference or a complete current return path for the signal propagating through the signal vias. Eventually, the impedance discontinuity between the signal vias on the circuit boards and the signal vias of the interconnection structure will be reduced so that the subsequent reflection effect and, hence, the return loss will be minimized. Due to the isolation of the signal vias by using the ground metal frame (or power metal frame), the crosstalk between signal vias will also be reduced to improve the quality of the signals. Consequently, the radiation on the edge of the connector (EMC/EMI problem) will be minimized as well. The surrounding vias (metal walls) will be like the extension of the ground vias (or power vias) surrounding the signal vias on the PCBs. They will provide the signal vias complete voltage reference surfaces and current return paths. Also, they will reduce the crosstalk between signal vias as well.

Capacitor (see FIG. 1 to FIG. 4): Again, two methods will be used to isolate the power via (or ground via): One is the use of the metal frame; the other is the use of surrounding vias (metal walls). The power via and the ground metal frame or the ground via and the power metal frame forms a capacitor, an element that can store electrical energy. The value of the capacitor can be properly designed by filling the space between the power via and the ground metal frame or the ground via and the power metal frame with a material having a selected permittivity value, or by adjusting the distance between the power via and the ground metal frame or the ground via and the power metal frame. The addition of a capacitor will benefit the power integrity of the circuit boards because the voltage fluctuations between the power planes and the ground planes can be minimized.

Finally, the overall signal integrity of the system will be improved due to the reduction of the voltage fluctuations in these power and ground planes. For the use of surrounding vias (metal walls), the surrounding vias (metal walls) will be like the extension of the ground vias (or power vias) surrounding the power vias (or ground vias) on the PCBs. This will form a capacitor to benefit the power integrity of the circuit boards as well.

Differential signaling (no figure shown here): If the surrounding via is connected with two signal traces on different layers and the polarity of the surrounding via is opposite to that of the inner signal via, the overall via structure will become a "differential signal pair". For the application of differential signaling, the metal frame will not be suitable. The individual via surrounding the signal via will be applicable. The application of the "differential via" will be a benefit to the signal integrity of the system due to the tight energy coupling between the inner signal via and the surrounding signal via.

BRIEF DESCRIPTION OF THE DRAWING

FIG. 1 shows the whole system with the novel interconnection system. There are two printed circuit boards (PCB) 1, 2. The interconnection structure 3 is between the two PCBs 1, 2.

FIG. 2 shows the port setting, the metal contacts between the bottom (and top) metal layer of the top (and bottom) PCB and the metal frame (or individual vias surrounding signal vias) of the interconnection structure will provide the signal vias the shortest continuous current return paths.

FIG. 3 shows the detailed complete current return paths of the whole novel interconnection system.

FIG. 4 shows the top view of the junction between the PCBs 1, 2 and the interconnection structure 3. For the metal frame structure, the slash area 27 and the metal walls 24, 25 will form the total metal frame 27. For the individual surrounding via structure, the material of the slash area 27 will become same as that of the substrate 3. The metal walls 24, 25 will be the individual vias surrounding the signal vias 20, 21.

FIG. 5 shows the whole system with the first prior interconnection structure 53. There are two printed circuit boards (PCBs) 51, 52. The interconnection structure 53 is between the two PCBs 51, 52.

FIG. 6 shows the port setting and the discontinuous current return path between the ground vias 64, 66, 65, 67 (or power vias 64, 66, 65, 67) surrounding the signal vias 70, 71 of the top PCB 51 (and bottom PCB 52) and the metal frame 75 of the interconnection structure 53.

FIG. 7 shows the detailed discontinuous current return path of the first prior interconnection system 53.

FIG. 8 shows the top view of the junction between the PCBs 51, 52 and the interconnection structure 53. The slash area 75 is the metal frame 75. The metal walls 64, 66, 65, 67 on the PCBs 51, 52 are the ground vias (or power vias) surrounding the signal vias 70, 71. The gaps 72, 73 between the metal frame 75 of the interconnection structure 53 and the ground vias (or power vias) 64, 66, 65, 67 surrounding the signal vias 70, 71 of the PCBs 51, 52 will cause the impedance discontinuity and discontinuous current return paths.

FIG. 9 shows the whole system with the second prior interconnection structure 112. There are two printed circuit boards (PCB) 110, 111. The interconnection structure 112 is between the two PCBs 110, 111.

FIG. 10 shows the port setting and the discontinuous current return path between the bottom 117 (and top 118) medium layer of the top 110 (and bottom 111) PCBs and the metal frame 130 of the interconnection structure 112.

FIG. 11 shows the detailed discontinuous current return path of the second prior interconnection system 112.

FIG. 12 shows the top view of the junction between the PCBs 110, 111 and the interconnection structure 112. The slash area 130 is the metal frame 130. There is no ground vias (or power vias) surrounding the signal vias 120, 123 on the PCBs 110, 111. The impedance of the signal vias 120, 123 on the PCBs 110, 111 will be different from that of the signal vias 120, 123 in the interconnection structure 112. This is so-called impedance discontinuity. Also, the current return paths are discontinuous for this configuration.

FIG. 13 shows the whole system with the third prior interconnection structure 153. There are two printed circuit boards (PCB) 151, 152. The interconnection structure 153 is between the two PCBs 151, 152.

FIG. 14 shows the port setting and the discontinuous current return path between the bottom 158 (and top 159) medium layer of the top 151 (and bottom 152) PCBs and the metal frame 172 of the interconnection structure 153.

FIG. 15 shows the detailed discontinuous current return path of the third prior interconnection system 153.

FIG. 16 shows the top view of the junction between the two PCBs 151, 152 and the interconnection structure 153. The slash area 172 is the metal frame 172. The ground via (or power via) 167 does not connect with the metal frame 172. Therefore, the metal frame 172 will not provide the current return path through the ground via (or power via) 167 for the signal vias 161, 164. Also, there is no ground vias (or power vias) surrounding the signal vias 161, 164 on the PCBs 151, 152. The impedance of the signal vias 161, 164 on the PCBs 151, 152 will be different from that of the signal vias 161, 164 in the interconnection structure 153. This is so-called impedance discontinuity.

FIG. 17 shows the whole system with the fourth prior interconnection structure 203. There are two printed circuit boards (PCB) 201, 202. The interconnection structure 203 is between the two PCBs 201, 202.

FIG. 18 shows the port setting and the discontinuous current return path between the top 201 (and bottom 202) PCBs and the interconnection structure 203.

FIG. 19 shows the detailed discontinuous current return path of the fourth prior interconnection system 203.

FIG. 20 shows the top view of the junction between the two PCBs 201, 202 and the interconnection structure 203. The signal vias 211, 214 will go from the top signal layer of the top PCB 201 to the bottom signal layer of the bottom PCB 202.

TABLE 1a

Figure 1:
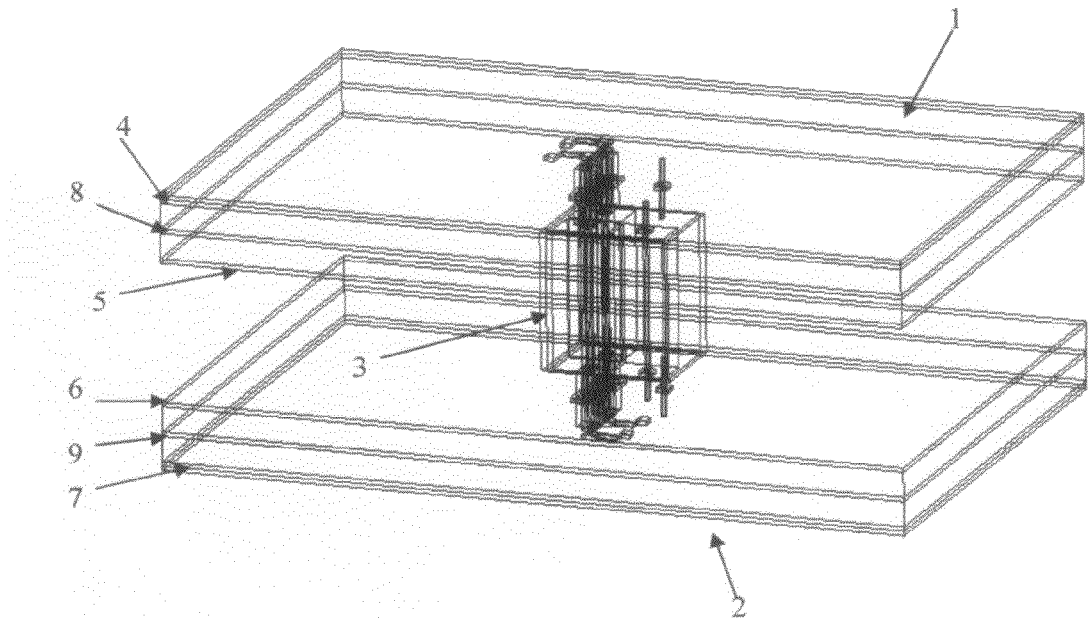
FIG. 1 to FIG. 4 show the novel interconnection structure 3 providing the shortest continuous current return paths and the impedance continuity for the signals on the two printed circuit boards 1, 2. Two different types of via structures in the interconnections are shown here: 1. metal frame 2. an individual outer via surrounding an inner via.
Figure 2:
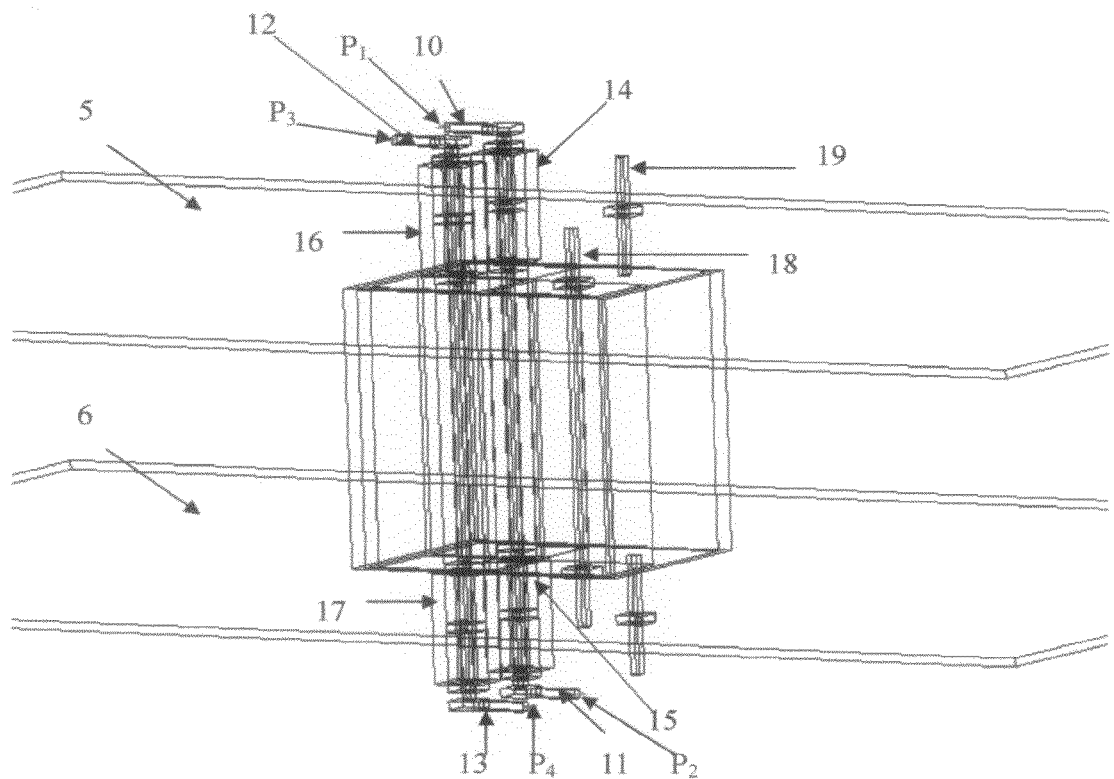
Figure 1A:
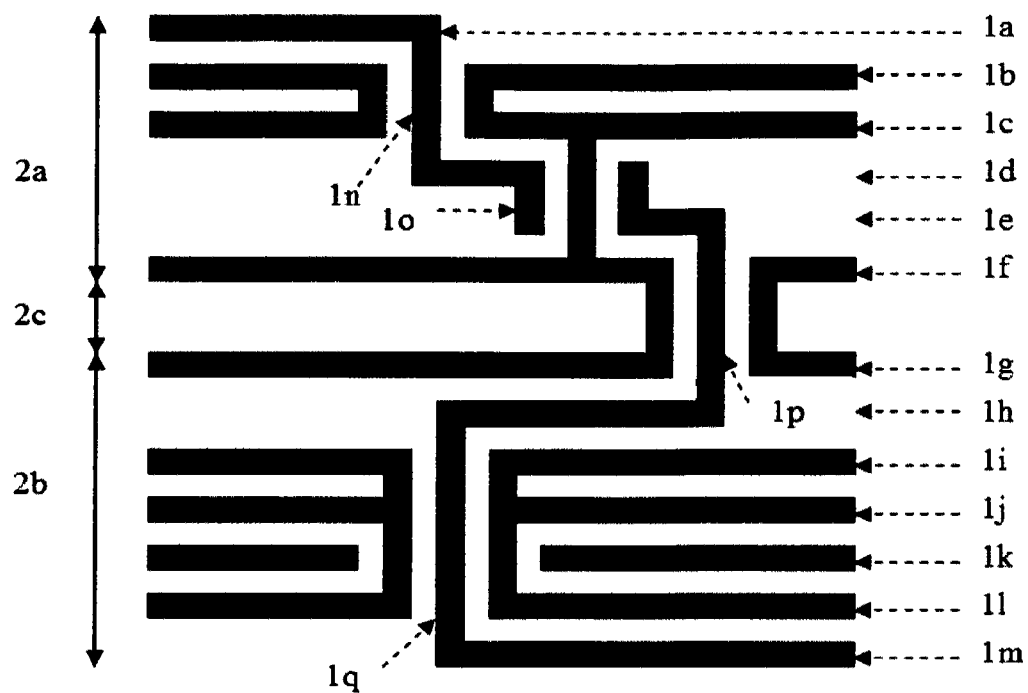

The elements of FIG. 1a

| | |
|---|---|
| The top signal layer of the top printed circuit board (PCB) | 1a |
| The ground layer (or power layer) on the second layer of the top PCB | 1b |
| The ground layer (or power layer) on the third layer of the top PCB | 1c |
| The signal layer on the fourth layer of the top PCB | 1d |

TABLE 1a-continued

The elements of FIG. 1a

| | |
|---|---|
| The signal layer on the fifth layer of the top PCB | 1e |
| The bottom ground layer (or power layer) of the top PCB | 1f |
| The top ground layer (or power layer) of the bottom PCB | 1g |
| The second signal layer of the bottom PCB | 1h |
| The third ground layer (or power layer) of the bottom PCB | 1i |
| The fourth ground layer (or power layer) of the bottom PCB | 1j |
| The fifth signal layer of the bottom PCB | 1k |
| The sixth ground layer (or power layer) of the bottom PCB | 1l |
| The bottom signal layer of the bottom PCB | 1m |
| The "Type A" via structure on the top PCB | 1n |
| The "Type B" via structure on the top PCB | 1o |
| The "Type A" via structure in the interconnection structure | 1p |
| The "Type A" via structure on the bottom PCB | 1q |
| The top PCB | 2a |
| The bottom PCB | 2b |
| The interconnection structure | 2c |

TABLE 1b

Figure 1B:
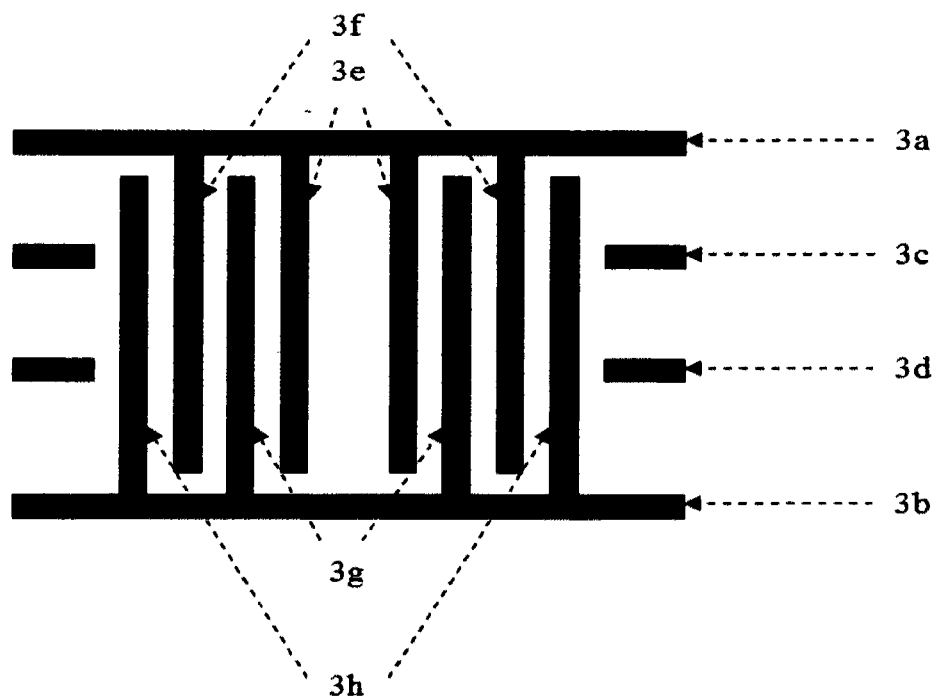

The elements of FIG. 1b

| | |
|---|---|
| The power plane of the printed circuit board (PCB) | 3a |
| The ground plane of the printed circuit board (PCB) | 3b |
| The signal layer or power layer or ground layer of the printed circuit board (PCB) | 3c |
| The signal layer or power layer or ground layer of the printed circuit board (PCB) | 3d |
| The inner power via | 3e |
| The second-level power via | 3f |
| The inner ground via | 3g |
| The second-level ground via | 3h |

TABLE 1c

Figure 1C:
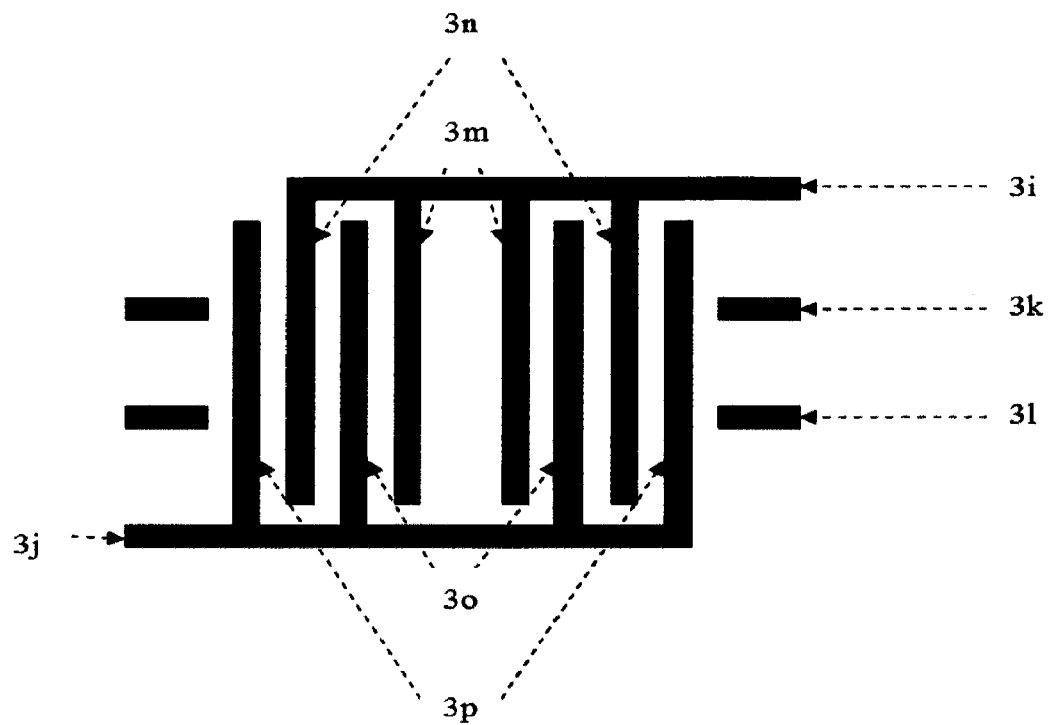

The elements of FIG. 1c

| | |
|---|---|
| The signal layer of the printed circuit board (PCB) | 3i |
| The signal layer of the printed circuit board (PCB) | 3j |
| The signal layer or ground layer or power layer of the printed circuit board (PCB) | 3k |
| The signal layer or ground layer or power layer of the printed circuit board (PCB) | 3l |
| The inner signal via | 3m |
| The second-level signal via | 3n |
| The inner signal via | 3o |
| The second-level signal via | 3p |

TABLE 1d

Figure 1D:
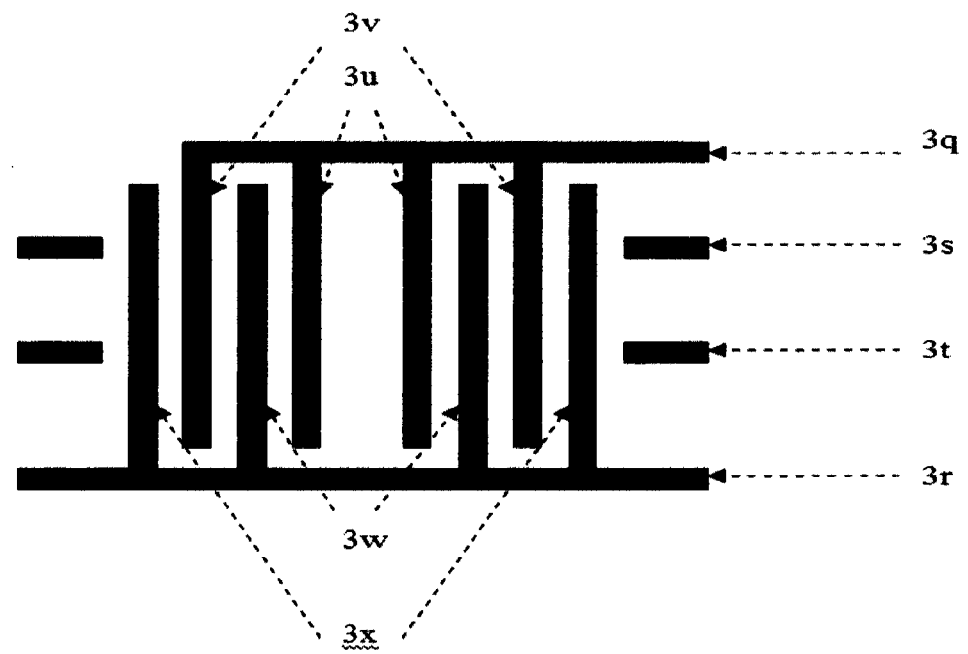
Figure 3:
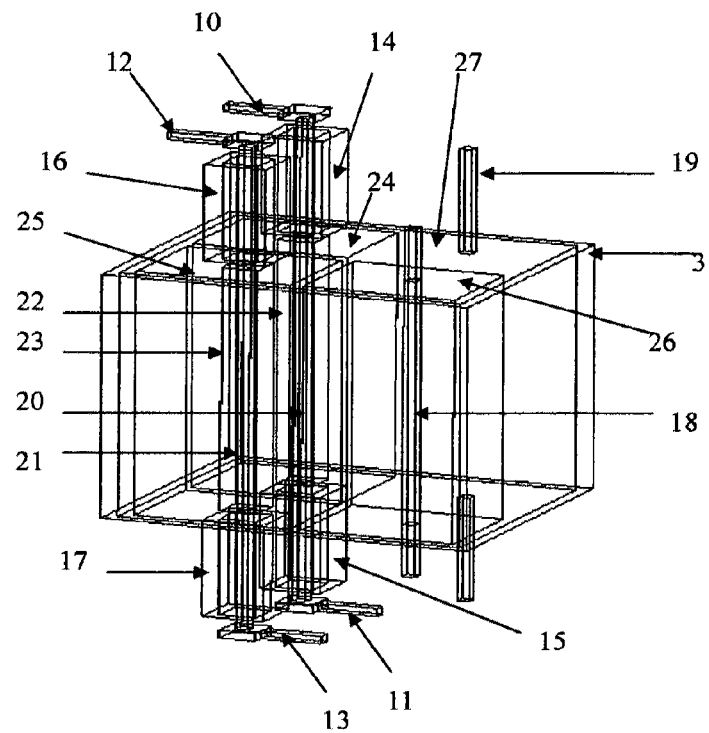
Figure 4:
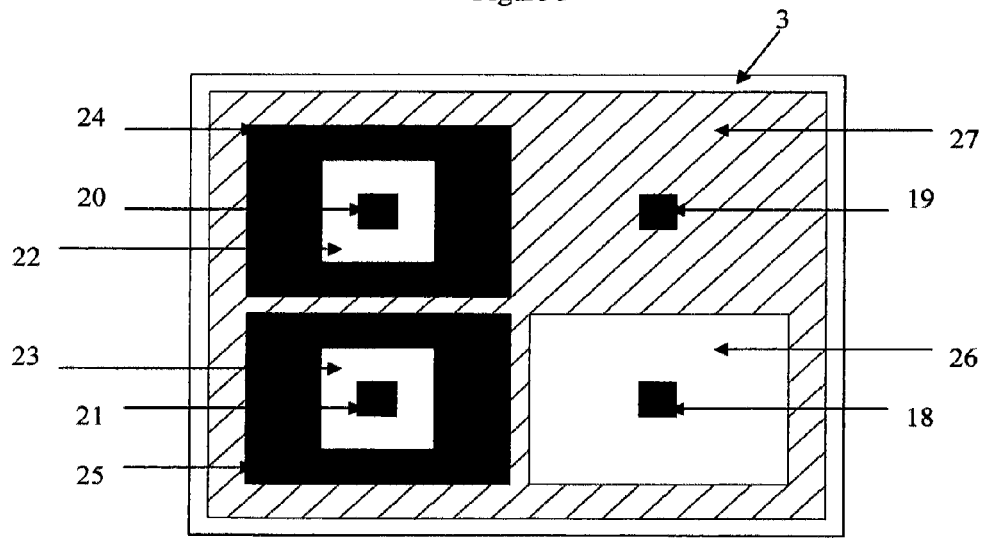
Figure 5:
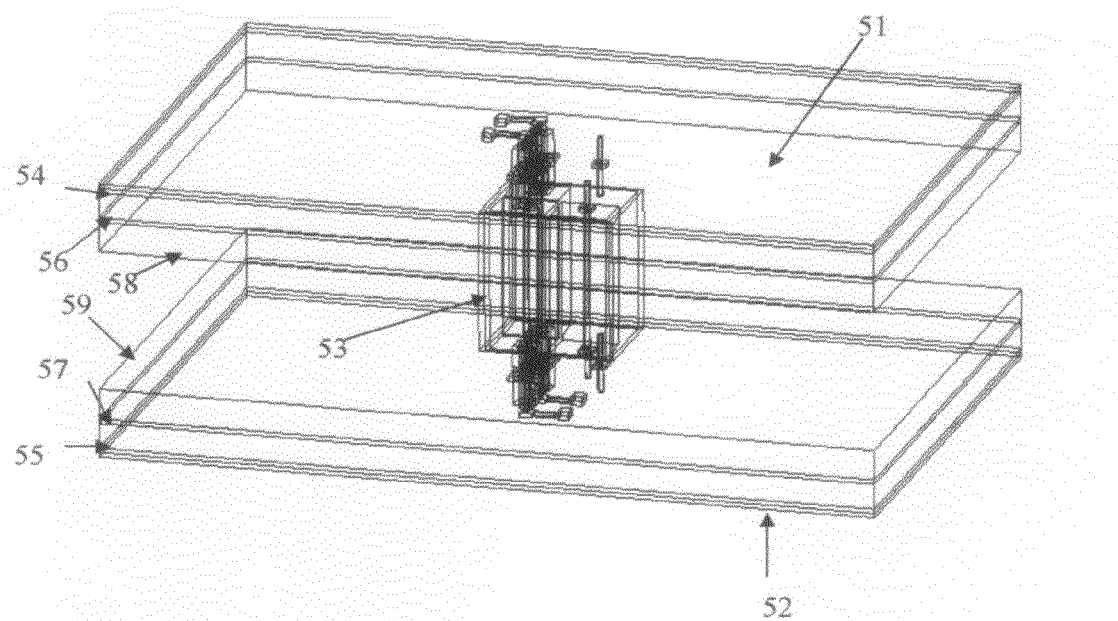
FIG. 5 to FIG. 8 show the first prior interconnection structure with the discontinuous impedance between the two printed circuit boards 51, 52 and the interconnection structure 53. The ground via (or the power via) 69 of the interconnection structure 53 will be used as the current return path between two printed circuit boards 51, 52. However, this is not the shortest current return path. This configuration will not improve the signal integrity of the whole system too much.
Figure 6:
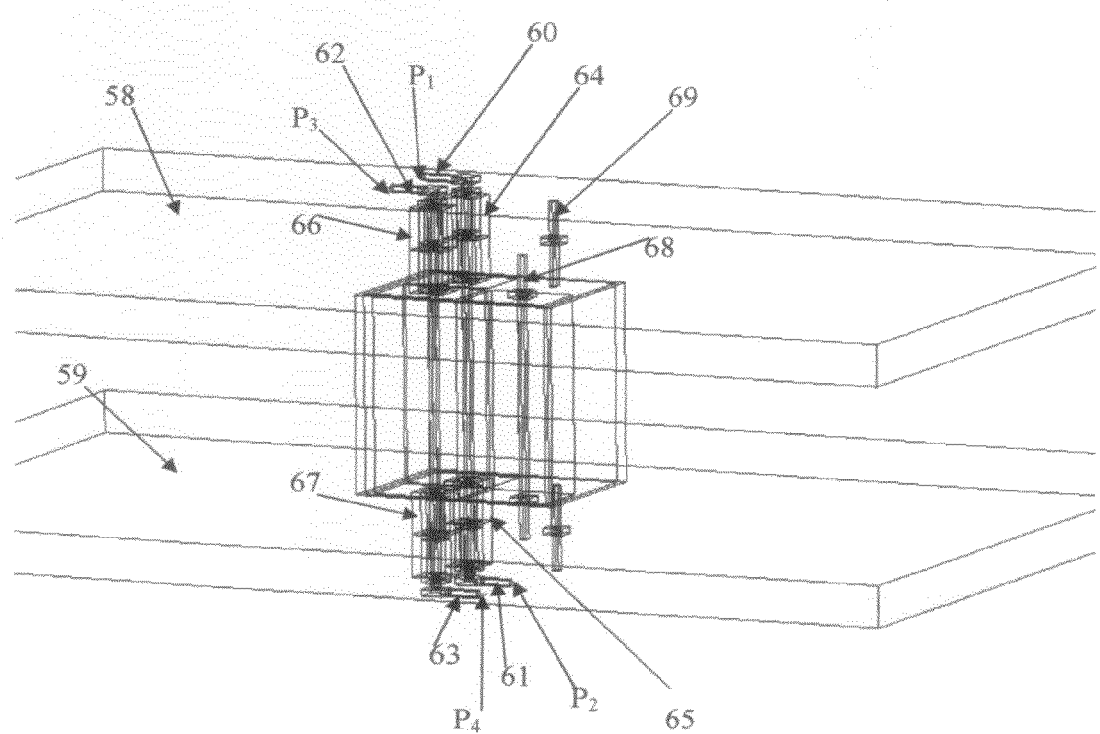
Figure 7:
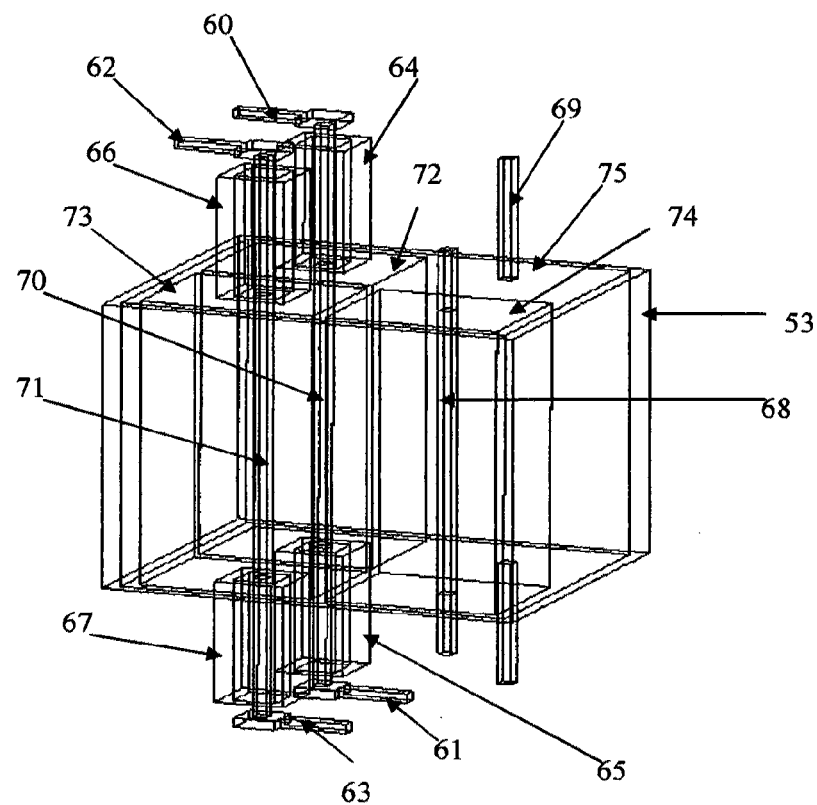
Figure 8:
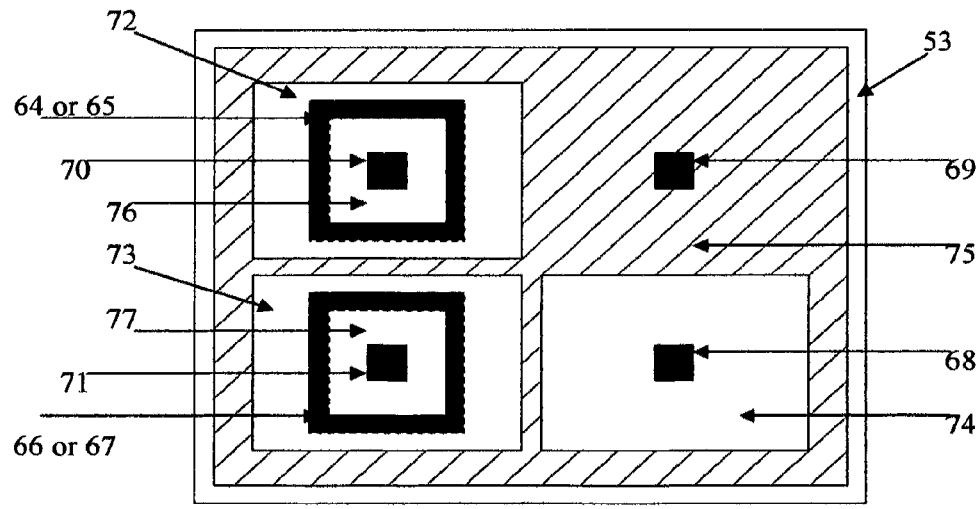
Figure 9:
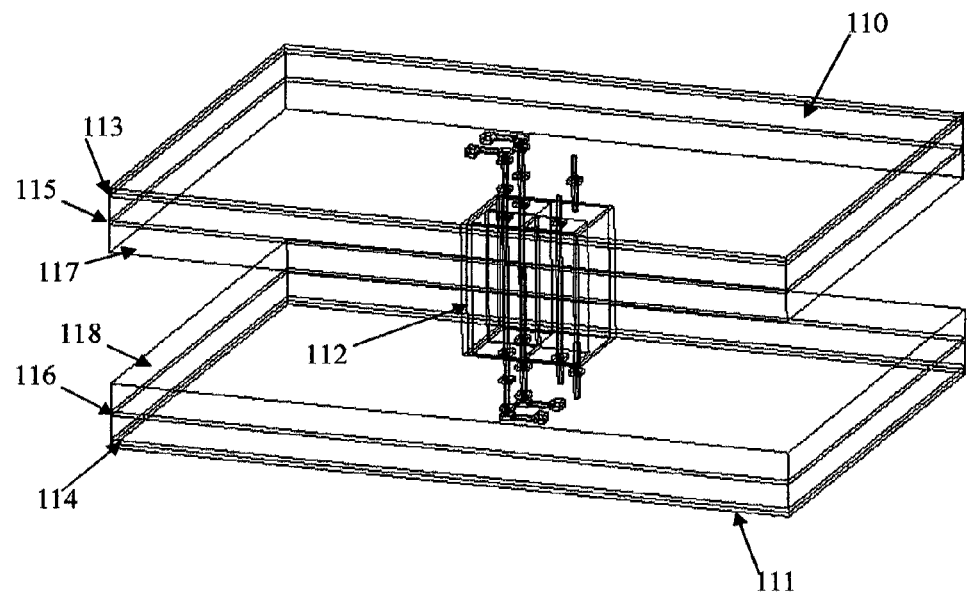
FIG. 9 to FIG. 12 show the second prior interconnection structure 112 using the ground via (or power via) 126 as the current return path for the signal vias 120, 123. However, this is not the shortest current return path. This configuration has impedance discontinuity of the signal vias between the two printed circuit boards 110, 111 and the interconnection structure 112.
Figure 10:
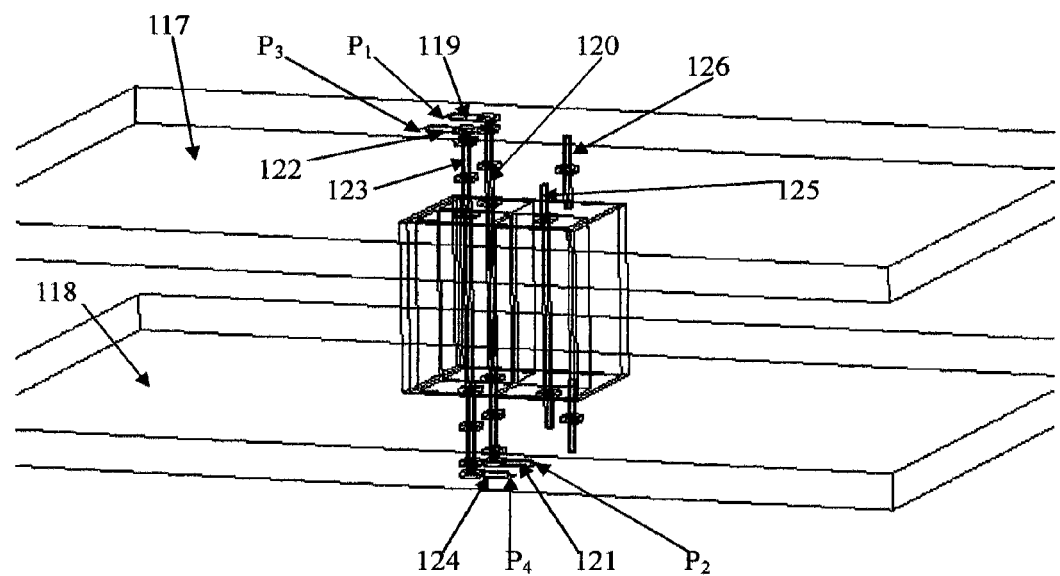
Figure 11:
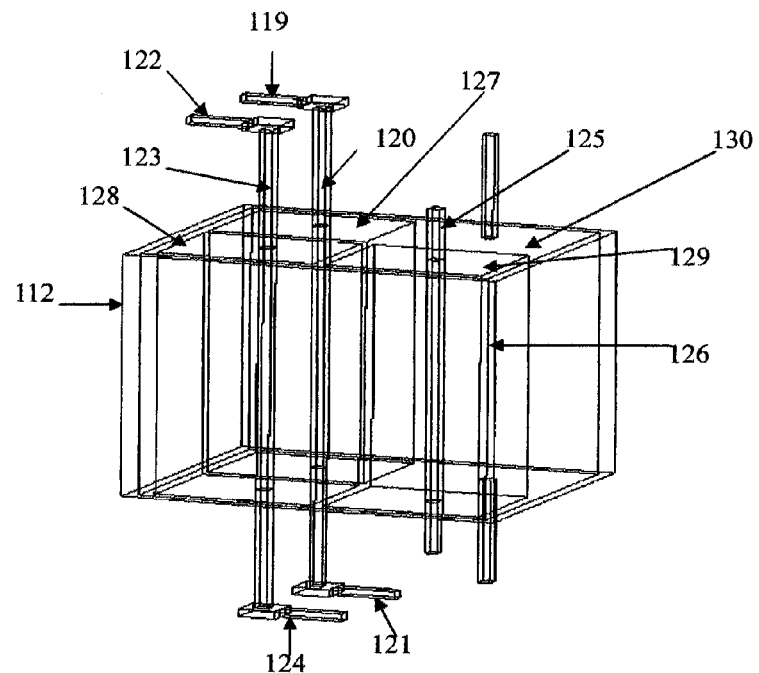
Figure 12:
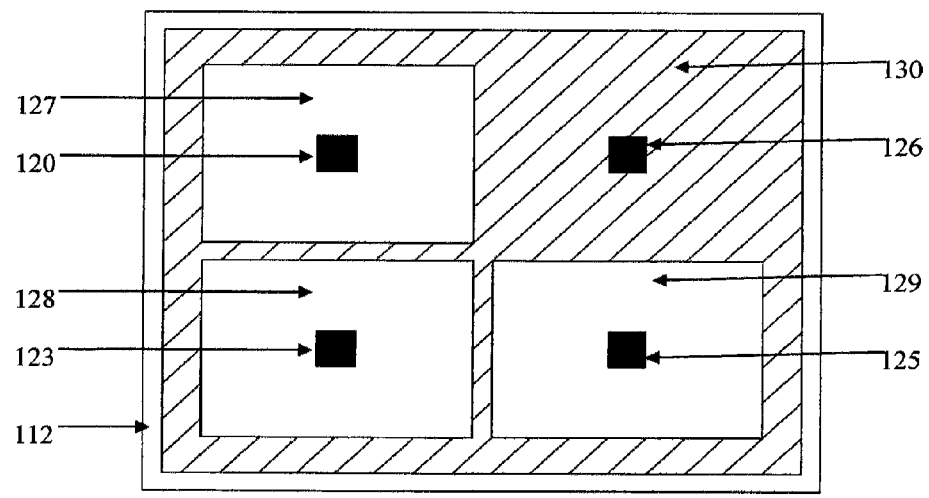
Figure 13:
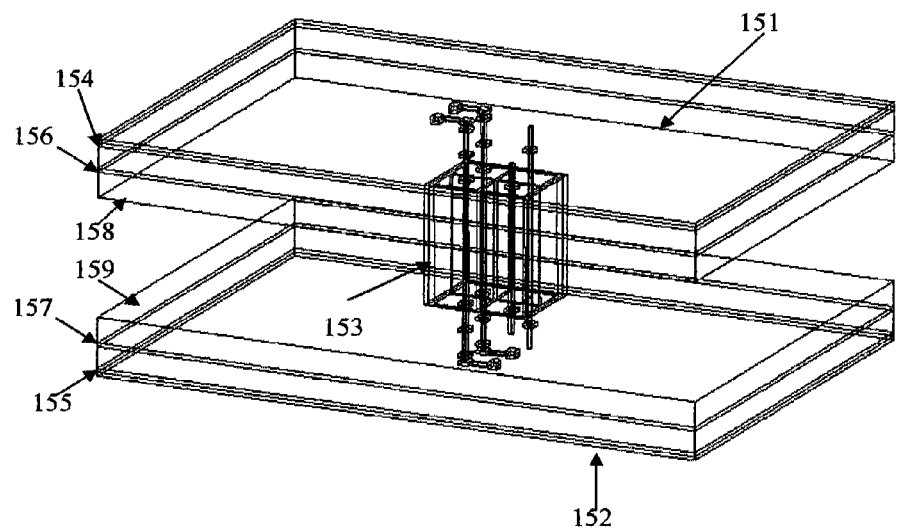
FIG. 13 to FIG. 16 show the third prior interconnection structure 153. The ground via (or power via) 167 does not connect with the metal frame 172. The metal frame 172 will only prevent the EM coupling between signal vias 161, 164 of the interconnection structure 153. However, the EM waves will leak from the junctions between the two printed circuit boards 151, 152 and the interconnection structure 153. Over all speaking, this configuration will not improve the signal integrity of the whole system too much.
Figure 14:
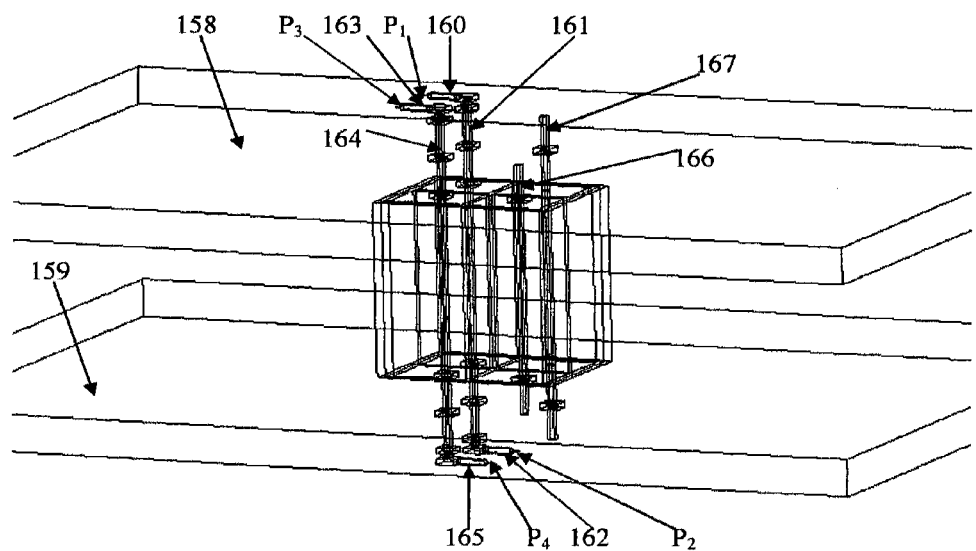
Figure 15:
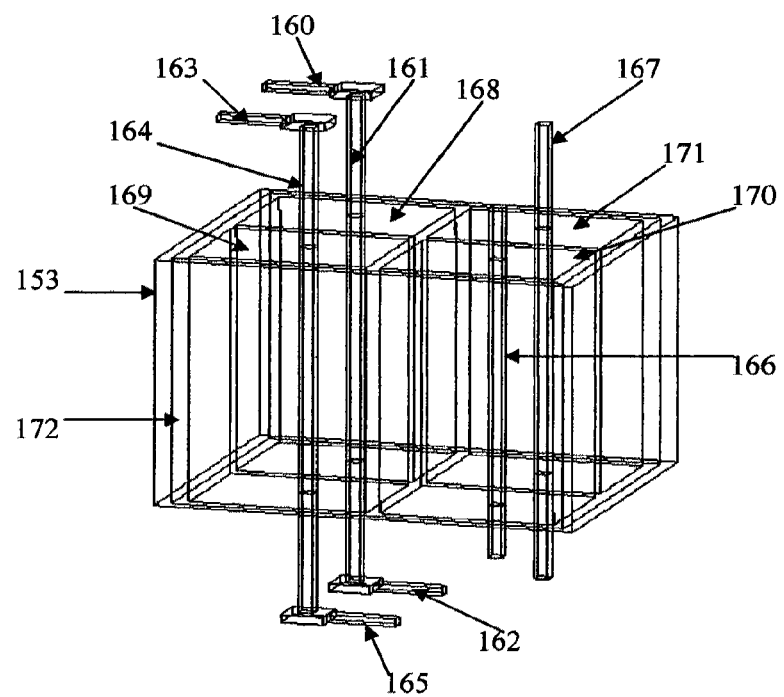
Figure 16:
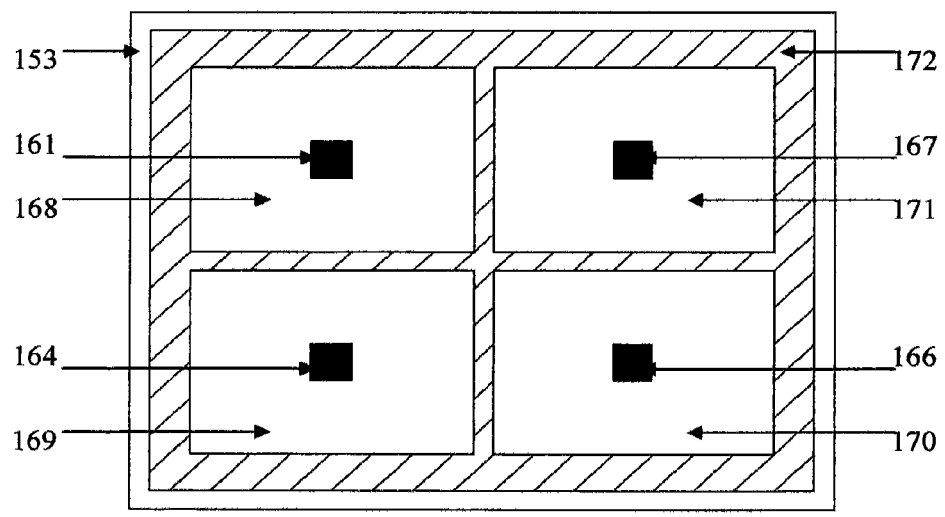
Figure 17:
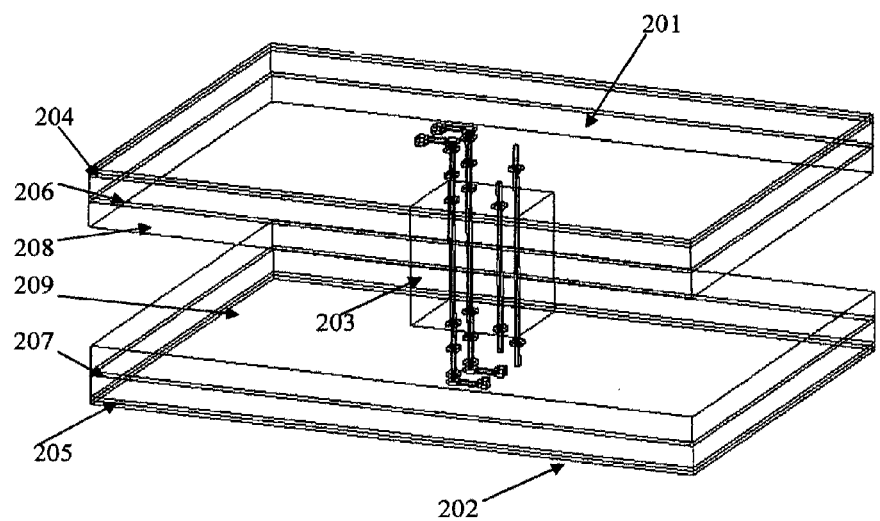
FIG. 17 to FIG. 20 show the fourth prior interconnection structure 203 without metal frame. There is no ground vias (or power vias) surrounding the signal vias 211, 214 on the PCBs 201, 202, either. Therefore, the EM coupling between signal vias 211, 214 will be the largest compared to other prior configurations.
Figure 18:
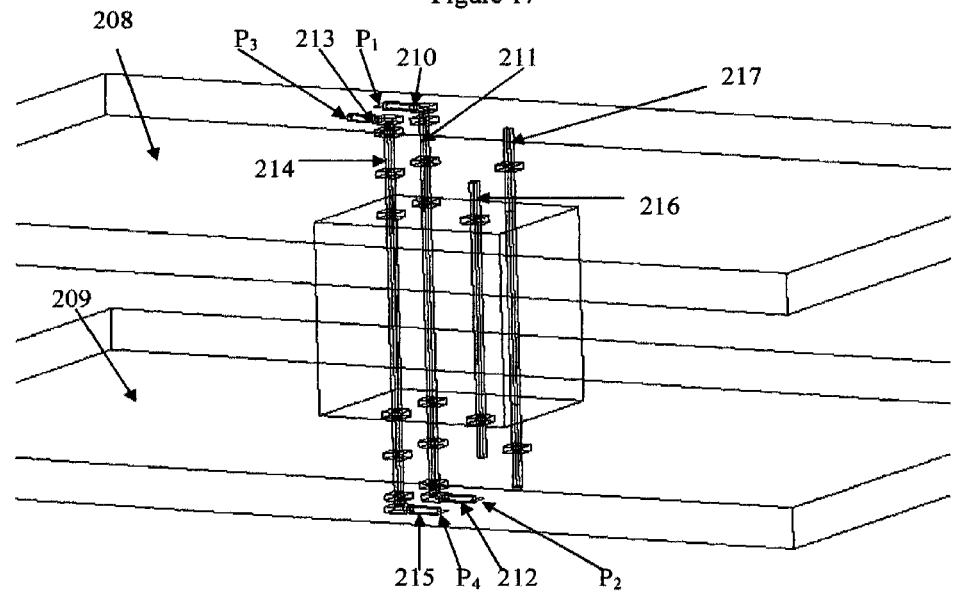
Figure 19:
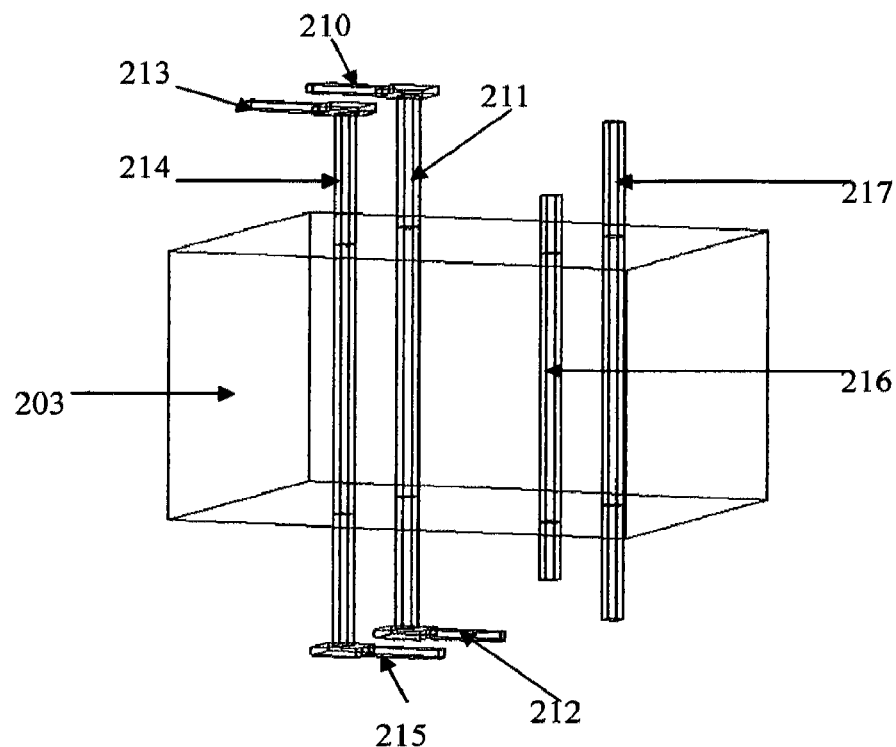
Figure 20:
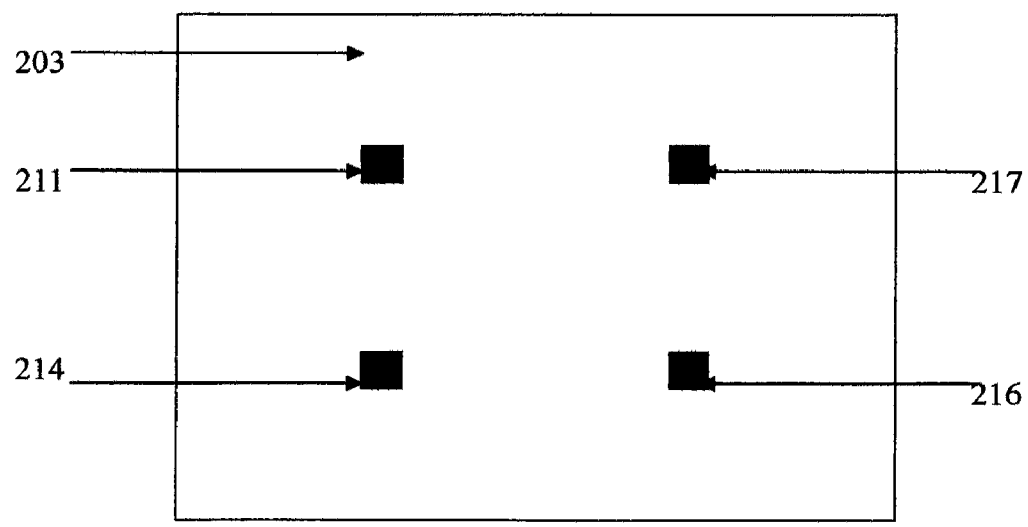

The elements of FIG. 1d

| | |
|---|---|
| The signal layer of the printed circuit board (PCB) | 3q |
| The ground (or power) plane of the printed circuit board (PCB) | 3r |
| The signal layer or power layer or ground layer of the printed circuit board (PCB) | 3s |
| The signal layer or power layer or ground layer of the printed circuit board (PCB) | 3t |
| The inner signal via | 3u |
| The second-level signal via | 3v |
| The inner ground (or power) via | 3w |
| The second-level ground (or power) via | 3x |

TABLE 1

The elements of FIG. 1-4

| | |
|---|---|
| Port 1 | $P_1$ |
| Port 2 | $P_2$ |
| Port 3 | $P_3$ |

TABLE 1-continued

The elements of FIG. 1-4

| Element | Ref |
|---|---|
| Port 4 | $P_4$ |
| The top printed circuit board (PCB) or substrate or die | 1 |
| The bottom printed circuit board (PCB) or substrate or die | 2 |
| The interconnection structure or connector | 3 |
| The top ground plane (or power plane) on the top printed circuit board or substrate or die | 4 |
| The bottom ground plane (or power plane) on the top printed circuit board or substrate or die | 5 |
| The top ground plane (or power plane) on the bottom printed circuit board or substrate or die | 6 |
| The bottom ground plane (or power plane) on the bottom printed circuit board or substrate or die | 7 |
| The middle power plane (or ground plane) on the top printed circuit board or substrate or die | 8 |
| The middle power plane (or ground plane) on the bottom printed circuit board or substrate or die | 9 |
| The first signal trace on the top layer of the top PCB | 10 |
| The first signal trace on the bottom layer of the bottom PCB | 11 |
| The second signal trace on the top layer of the top PCB | 12 |
| The second signal trace on the bottom layer of the bottom PCB | 13 |
| The ground via (or power via) surrounding the first signal via on the top PCB | 14 |
| The ground via (or power via) surrounding the first signal via on the bottom PCB | 15 |
| The ground via (or power via) surrounding the second signal via on the top PCB | 16 |
| The ground via (or power via) surrounding the second signal via on the bottom PCB | 17 |
| Power via (or ground via) | 18 |
| Ground via (or power via) | 19 |
| The first signal via in the interconnection structure and PCB | 20 |
| The second signal via in the interconnection structure and PCB | 21 |
| The medium material between the first signal via and the metal wall in the interconnection structure | 22 |
| The medium material between the second signal via and the metal wall in the interconnection structure | 23 |
| The metal wall surrounding the first signal via in the interconnection structure | 24 |
| The metal wall surrounding the second signal via in the interconnection structure | 25 |
| The medium material between the power via (or ground via) and the metal frame | 26 |
| The metal frame in the interconnection structure | 27 |

TABLE 2

The elements of FIG. 5-8

| Element | Ref |
|---|---|
| Port 1 | $P_1$ |
| Port 2 | $P_2$ |
| Port 3 | $P_3$ |
| Port 4 | $P_4$ |
| The top printed circuit board (PCB) or substrate or die | 51 |
| The bottom printed circuit board (PCB) or substrate or die | 52 |
| The interconnection structure or connector | 53 |
| The top ground plane (or power plane) on the top printed circuit board or substrate or die | 54 |
| The bottom ground plane (or power plane) on the bottom printed circuit board or substrate or die | 55 |
| The middle power plane (or ground plane) on the top printed circuit board or substrate or die | 56 |
| The middle power plane (or ground plane) on the bottom printed circuit board or substrate or die | 57 |
| The bottom medium layer on the top printed circuit board or substrate or die | 58 |
| The top medium layer on the bottom printed circuit board or substrate or die | 59 |
| The first signal trace on the top layer of the top PCB | 60 |
| The first signal trace on the bottom layer of the bottom PCB | 61 |
| The second signal trace on the top layer of the top PCB | 62 |
| The second signal trace on the bottom layer of the bottom PCB | 63 |
| The ground via (or power via) surrounding the first signal via on the top PCB | 64 |
| The ground via (or power via) surrounding the first signal via on the bottom PCB | 65 |

TABLE 2-continued

The elements of FIG. 5-8

| Element | Ref |
|---|---|
| The ground via (or power via) surrounding the second signal via on the top PCB | 66 |
| The ground via (or power via) surrounding the second signal via on the bottom PCB | 67 |
| The power via (or ground via) | 68 |
| The ground via (or power via) | 69 |
| The first signal via in the interconnection structure and PCB | 70 |
| The second signal via in the interconnection structure and PCB | 71 |
| The medium material between the first signal via and the metal frame in the interconnection structure | 72 |
| The medium material between the second signal via and the metal frame in the interconnection structure | 73 |
| The medium material between the power via (or ground via) and the metal frame in the interconnection structure | 74 |
| The metal frame in the interconnection structure | 75 |
| The medium material between the first signal via and the ground via on the PCB | 76 |
| The medium material between the second signal via and the ground via on the PCB | 77 |

TABLE 3

The elements of FIG. 9-12

| Element | Ref |
|---|---|
| Port 1 | $P_1$ |
| Port 2 | $P_2$ |
| Port 3 | $P_3$ |
| Port 4 | $P_4$ |
| The top printed circuit board (PCB) or substrate or die | 110 |
| The bottom printed circuit board (PCB) or substrate or die | 111 |
| The interconnection structure or connector | 112 |
| The top ground plane (or power plane) on the top printed circuit board or substrate or die | 113 |
| The bottom ground plane (or power plane) on the bottom printed circuit board or substrate or die | 114 |
| The middle power plane (or ground plane) on the top printed circuit board or substrate or die | 115 |
| The middle power plane (or ground plane) on the bottom printed circuit board or substrate or die | 116 |
| The bottom medium layer on the top printed circuit board or substrate or die | 117 |
| The top medium layer on the bottom printed circuit board or substrate or die | 118 |
| The first signal trace on the top layer of the top PCB | 119 |
| The first signal via in the interconnection structure and PCB | 120 |
| The first signal trace on the bottom layer of the bottom PCB | 121 |
| The second signal trace on the top layer of the top PCB | 122 |
| The second signal via in the interconnection structure and PCB | 123 |
| The second signal trace on the bottom layer of the bottom PCB | 124 |
| The power via (or ground via) | 125 |
| The ground via (or power via) | 126 |
| The medium material between the first signal via and the metal frame in the interconnection structure | 127 |
| The medium material between the second signal via and the metal frame in the interconnection structure | 128 |
| The medium material between the power via (or ground via) and the metal frame in the interconnection structure | 129 |
| The metal frame in the interconnection structure | 130 |

TABLE 4

The elements of FIG. 13-16

| Element | Ref |
|---|---|
| Port 1 | $P_1$ |
| Port 2 | $P_2$ |
| Port 3 | $P_3$ |
| Port 4 | $P_4$ |
| The top printed circuit board (PCB) or substrate or die | 151 |
| The bottom printed circuit board (PCB) or substrate or die | 152 |
| The interconnection structure or connector | 153 |
| The top ground plane (or power plane) on the top printed circuit board or substrate or die | 154 |
| The bottom ground plane (or power plane) on the bottom printed | 155 |

TABLE 4-continued

The elements of FIG. 13-16

| | |
|---|---|
| circuit board or substrate or die | |
| The middle power plane (or ground plane) on the top printed circuit board or substrate or die | 156 |
| The middle power plane (or ground plane) on the bottom printed circuit board or substrate or die | 157 |
| The bottom medium layer on the top printed circuit board or substrate or die | 158 |
| The top medium layer on the bottom printed circuit board or substrate or die | 159 |
| The first signal trace on the top layer of the top PCB | 160 |
| The first signal via in the interconnection structure and PCB | 161 |
| The first signal trace on the bottom layer of the bottom PCB | 162 |
| The second signal trace on the top layer of the top PCB | 163 |
| The second signal via in the interconnection structure and PCB | 164 |
| The second signal trace on the bottom layer of the bottom PCB | 165 |
| The power via (or ground via) | 166 |
| The ground via (or power via) | 167 |
| The medium material between the first signal via and the metal frame in the interconnection structure | 168 |
| The medium material between the second signal via and the metal frame in the interconnection structure | 169 |
| The medium material between the power via (or ground via) and the metal frame in the interconnection structure | 170 |
| The medium material between the ground via (or power via) and the metal frame in the interconnection structure | 171 |
| The metal frame in the interconnection structure | 172 |

TABLE 5

The elements of FIG. 17-20

| | |
|---|---|
| Port 1 | $P_1$ |
| Port 2 | $P_2$ |
| Port 3 | $P_3$ |
| Port 4 | $P_4$ |
| The top printed circuit board (PCB) or substrate or die | 201 |
| The bottom printed circuit board (PCB) or substrate or die | 202 |
| The interconnection structure or connector | 203 |
| The top ground plane (or power plane) on the top printed circuit board or substrate or die | 204 |
| The bottom ground plane (or power plane) on the bottom printed circuit board or substrate or die | 205 |
| The middle power plane (or ground plane) on the top printed circuit board or substrate or die | 206 |
| The middle power plane (or ground plane) on the bottom printed circuit board or substrate or die | 207 |
| The bottom medium layer on the top printed circuit board or substrate or die | 208 |
| The top medium layer on the bottom printed circuit board or substrate or die | 209 |
| The first signal trace on the top layer of the top PCB | 210 |
| The first signal via in the interconnection structure and PCB | 211 |
| The first signal trace on the bottom layer of the bottom PCB | 212 |
| The second signal trace on the top layer of the top PCB | 213 |
| The second signal via in the interconnection structure and PCB | 214 |
| The second signal trace on the bottom layer of the bottom PCB | 215 |
| The power via (or ground via) | 216 |
| The ground via (or power via) | 217 |

DETAILED DESCRIPTION

The purpose of the invention is to provide a novel interconnection structure that can reduce via-to-via crosstalk, the impedance discontinuity, and EMC radiation for the whole system. In particular, the signal integrity of the whole system will be improved and the edge radiation of the PCB board, IC packaging, or the die will be minimized due to the use of the novel interconnection structure.

Two 4-layer (2 signal layers and 2 power layers or 2 ground layers) circuit boards with an interconnection structure are used for demonstrating the interest of the invention. The 4-layer circuit board is comprised of 1 signal layer, 3 medium layers, 2 ground layers (or 2 power layers) and 1 power layer (or 1 ground layer), 1 individual ground via, 1 individual power via, and 2 signal via structures. The signal vias of the interconnection structure electrically connect the signal traces on the signal layers of the PCBs. The ground via (or power via) could be built surrounding the signal via or could be surrounded by the signal via. In this patent, the interconnection structure with the metal frame or ground via (or power via) surrounding the signal via is used for the examination. The interconnection structure is a 2-layer structure. The interconnection structure with ground via (or power via) surrounded by the signal via is based on the same concept introduced in the application that is entitled "A Novel Via Structure for Improving Signal Integrity," (application Ser. No. 11/651,338). For the metal frame built surrounding the signal via, the ground frame (or the power frame) will provide current return paths and reference surfaces for the signal vias. For the ground via (or the power via) built surrounding the signal via, the ground via (or the power via) will provide an individual shortest current return path for each signal via. Consequently, the EM wave generated by the signal via will not penetrate through the ground via (or power via) and, as a result, the via-to-via crosstalk will be mitigated. Also, the surrounding ground via (or power via) will reduce the impedance discontinuity. This in turn will minimize the return loss and, hence, will improve the signal integrity.

A circuit system with an interconnection structure and two PCBs (FIG. 1-FIG. 4) are used to explain the concept of the invention. Each PCB circuit structure comprises 1 signal layer, 3 medium layers, 2 ground layers (or 2 power layers), 1 power layer (or 1 ground layer), 2 signal via structures, 2 ground via (or power via) structures surrounding the 2 signal via structures, 1 independent ground via structure and 1 independent power via structure. The interconnection structure comprises 1 medium layer, 2 signal via, 1 metal frame [or 2 ground via (or power via)] surrounding the 2 signal via, 1 independent ground via, and 1 independent power via.

The interconnection structure can be a multi-layer structure such as a PCB or an IC packaging circuit. Thus, it turns out to be a combination system that is composed of multiple circuit boards. The concept of the invention can be applied to the combination of PCBs, integrated circuit packaging, integrated circuits on a die, and many other types of circuits. Note that it is not necessary that the novel interconnection structures built on each multi-layer circuit board or the combination system of multiple circuit boards go through all the way down from the top layer on the very top of the circuit board to the bottom layer on the very bottom layer. The novel interconnection structures can be used sectionally for one signal net. For example, please see FIG. 1a, the signal net may go from the signal layer 1a on the top layer of the top circuit board 2a to the signal layer on the fourth layer 1d of the top circuit board 2a through a "Type A" via structure in. Then, the signal net goes along a section of transmission line on the fourth layer 1d of the top circuit board 2a. After that, it goes down to the signal layer on the fifth layer 1e of the top circuit board 2a through a "Type B" via structure 1o. The signal net will go along a section of transmission line again on the fifth layer 1e of the top circuit board 2a. Then, it goes down to the signal layer on the second layer 1h of the bottom circuit board 2b through a "Type A" via structure 1p in the interconnection structure 2c. The signal net will travel along a section of transmission line on the second layer 1h of the bottom circuit board 2b, and then goes down to the signal layer on the bottom layer 1m of the bottom circuit board 2b through a "Type A" via structure 1q. The "Type A" ground via structure 1q connects all ground planes of the bottom circuit board 2b. However, it is not necessary that the "Type A" ground via $1q$ connects with the ground plane on the fourth layer $1j$ of the bottom circuit board $2b$. The reason is that the "Type A" ground via $1q$ connecting the ground plane on the third layer $1i$ of the bottom circuit board $2b$ and that on the sixth layer $1l$ of the bottom circuit board $2b$ will be sufficient to provide a complete current return path for the signal. Therefore, the designer will decide "all" of the ground planes that are needed to be connected with the "Type A" ground via $1q$.

For the application of the "Type C" via structure, the capacitor can be designed as an "interdigitated capacitor" (see FIG. $1b$). FIG. $1b$ shows a 4-level interdigitated capacitor. The overlapped area of the interdigitated capacitor will be larger than that of the parallel capacitor. It means that the value of the interdigitated capacitor will be larger than that of the parallel capacitor. Of course, the capacitor can be extended to an n-level capacitor very easily. Also, it is not necessary for the capacitor to be built between the power and the ground planes. The capacitor can be built between the two signal traces (see FIG. $1c$) or between the signal trace and the ground plane as well (see FIG. $1d$).

FIG. 1-4 show the novel interconnection structure 3 connected with the PCBs 1, 2. The novel interconnection structure 3 is used for demonstrating the extended implement of the "Type A" via structure of the application that is entitled "A Novel Via Structure for Improving Signal Integrity," (application Ser. No. 11/651,338). The novel interconnection structure alleviates the factors which adversely affect the signal integrity such as via-to-via coupling, impedance discontinuity, EM radiation, and so on.

The top circuit board is comprised of a substrate 1; two signal traces 10, 12; two ground layers (or two power layers) 4 and 5; one power layer (or one ground layer) 8; two signal vias 20, 21; two ground vias (or two power vias) 14, 16 surrounding the two signal vias 20, 21; one independent power via (or ground via) 18; and one independent ground via (or power via) 19. The bottom circuit board is comprised of the same structures as the top circuit board: a substrate 2; two signal traces 11, 13; two ground layers (or two power layers) 6 and 7; one power layer (or one ground layer) 9; two signal vias 20, 21; two ground vias (or two power vias) 15, 17 surrounding the two signal vias 20, 21; one independent power via (or ground via) 18; and one independent ground via (or power via) 19. The interconnection structure is comprised of a two-layer substrate 3; two signal vias 20, 21; a metal frame 27 [or two ground vias (or two power vias) 24, 25] surrounding the two signal vias 20, 21; one independent power via (or ground via) 18; and one independent ground via (or power via) 19. Note that any two or above vias connect electrically will form a metal frame. The use of the metal frame 27 is mainly for providing a continuous current return path of the signal vias. Also, the ground (or power) metal frame 27 and the power via (or ground via) 18 will form a capacitor in the interconnection structure. However, the circuit designer can create a capacitor by using a ground via (or power via) (not shown) surrounding the power via (or ground via) 18 instead of the use of the metal frame 27. The formation of the capacitor will be based on the same concept of the Type C version of the application that is entitled "A Novel Via Structure for Improving Signal Integrity," (application Ser. No. 11/651,338).

The two signal traces 10, 12 are electrically connected to the signal traces 11, 13 by the signal vias 20, 21. The ground vias (or power vias) 14, 16 electrically connects the ground layers (or the power layers) 4, 5 on the PCB 1. The ground vias (or power vias) 15, 17 electrically connect the ground layers (or the power layers) 6, 7 on the PCB 2. They are plated and surround the signal vias 20, 21. The via structure 24, 25 surrounding the signal vias 20, 21 in the interconnection structure will connect the ground vias (or power vias) 14, 16 of the top PCB 1 with the ground vias (or power via) 15, 17 of the bottom PCB 2. This will provide complete voltage reference surfaces and the shortest current return paths for the signals that propagate along the signal vias 20, 21. The impedances of signal vias 20, 21 can be designed properly to be consistent when they pass through PCBs 1, 2 and the interconnection structure 3. Also, the connection of the ground vias (or power vias) 14, 16, 15, 17, and the metal walls 24, 25 will isolate any electromagnetic (EM) wave generated by the signal vias 20, 21 and, hence, they will prevent any EM couplings with each other or other vias (not shown). The capacitor, which can be either formed by the power via (or ground via) 18 and the ground metal frame (or power metal frame) 27 or created by both of the power via (or ground via) 18 and ground via (or power via) (not shown) surrounding the power via (or ground via) 18 can be a benefit to the signal integrity of the system.

The metal frame structure 27 or via structures 24, 25 in the substrate 3 can be formed by mechanical or laser drilling. The via holes are "through holes" in the example of the invention. First, the metal frame 27 and through vias 24, 25 are formed in order to connect the two ground layers (or the two power layers) 5, 6 on PCBs 1, 2. The material of the metal frame 27 and through vias 24, 25 can be any highly conductive alloy or metal such as Tin (Sn), silver (Ag), copper (Cu), gold (Au). The signal traces 10, 12 are then electrically connected with the signal traces 11, 13 through the signal vias 20, 21. Any techniques such as casting, plating, or non-plating can be adapted for the formation of any via and metal frame in the embodiments of the invention.

The ground vias (or power vias) 24, 25 and the metal frame 27 are plated with copper in this example of the invention. The signal vias, ground vias and power vias are square and concentric. However, they do not necessarily have to be square or concentric. For example, the signal vias 20, 21 can be solid cylinders or hollow cylinders non-centric with the ground vias (or power vias) 24, 25. Also, the signal vias 20, 21 must be kept at least a distance equal to the size of the anti-pad from the ground vias (or power vias) 24, 25. The previous application that is entitled "A Novel Via Structure for Improving Signal Integrity," (application Ser. No. 11/651,338) mentions that the thickness of the ground vias (or power via) 24, 25 must be larger than the "skin depth" associated with the frequency of the signal propagating along the signal vias 20, 21. However, it is not necessary that the thickness of the ground vias (or power via) 24, 25 has to be larger than the "skin depth" since the overall performance of the system could also be impacted by other factors such as impedance control, current return paths, dielectric losses, etc. Therefore, the insertion loss ($S_{21}$) can be affected by many factors, not only the "skin depth". The signal integrity can be improved by eliminating all possible negative factors.

FIGS. 5-8 show the first prior interconnection structure. There are no ground planes (or power planes) on the bottom of the PCB 51 and the top of the PCB 52. Also, the medium material 72, 73 cannot electrically connect the ground vias (or power vias) 64, 66 on the PCB 51 with the ground vias (or power vias) 65, 67 on the PCB 52. Therefore, the gaps will exist at the junctions of the ground vias (or power vias) 64, 66, 65, 67 on the PCBs 51, 52 and the metal frame 75. The gaps will cause the impedance discontinuity of the signal vias 70, 71. The EM waves will leak from the gaps. The leakage of the EM waves will degrade the signal integrity as well. Also, the impedance between the signal traces and the signal vias are discontinuous so there will be reflected signals and they will affect the signal quality. The ground via (or power via) 69 connects electrically to the ground planes (or power planes) on both PCBs and the metal frame 75 of the interconnection structure 53. This will provide a current return path for the signals. However, the current return path is not the shortest current return path for the signals. Therefore, it will improve the signal integrity only a little.

FIG. 9-12 show the second prior interconnection structure. There are no ground planes (or power planes) on the bottom of the PCB 110 and the top of the PCB 111. There are no ground vias (or power vias) surrounding the signal vias on the PCB 110 and the PCB 111, either. Therefore, it cannot provide either a complete voltage reference surface or the shortest current return paths for signal vias with only metal frame 130 in the interconnection structure 112. A discontinuity will exist at the junctions of the PCBs 110, 111 and the metal frame 130. The EM waves will leak from this discontinuity. The leakage of the EM waves will also degrade the signal integrity.

The impedance of the signal vias 120, 123 on the PCBs 110, 111 will be different from that of the signal vias 120, 123 in the interconnection structure 112. Also, the impedance between the signal traces and the signal vias are discontinuous so there will be reflected signals. They will affect the signal quality. The ground via (or power via) 126 connects electrically to the ground planes (or power planes) on both PCBs 110, 111 and the metal frame 130 of the interconnection structure 112. It will provide a current return path for the signals. However, the current return path is not the shortest current return path for the signals. Therefore, it will improve the signal integrity only a little.

FIGS. 13-16 show the third prior interconnection structure. There are no ground planes (or power planes) on the bottom of the PCB 151 or the top of the PCB 152. There are no ground vias (or power vias) surrounding the signal vias on the PCB 151 or the PCB 152, either. Therefore, it cannot provide either a complete voltage reference surface or the shortest current return paths for signal vias 161, 164 with only metal frame 172 in the interconnection structure 153. A discontinuity will exist at the junctions of the PCBs 151, 152 and the metal frame 172. The EM waves will leak from this discontinuity. The leakage of the EM waves will degrade the signal integrity as well.

The impedance of the signal vias 161, 164 on the PCBs 151, 152 will be different from that of the signal vias 161, 164 in the interconnection structure 153. Also, the impedances between the signal traces and the signal vias are discontinuous so there will be reflected signals. They will affect the signal quality. The ground via (or power via) 167 connects electrically to the ground planes (or power planes) on both PCBs 151, 152; but it does not connect with the metal frame 172 of the interconnection structure 153. Therefore, the ground via (or power via) 167 will provide a very long current return path between the ground planes (or power planes) on the PCBs 151, 152 and the signal vias 161, 164. The very long current return path will improve the signal integrity very little.

FIGS. 17-20 show the fourth prior interconnection structure. There are no ground planes (or power planes) on the bottom of the PCB 201 and the top of the PCB 202. There are no ground vias (or power vias) surrounding the signal vias on the PCB 201 and the PCB 202, either. Therefore, it cannot provide either a complete voltage reference surface or the shortest current return paths for signal vias 211, 214. The EM waves will propagate between the metal planes on the PCBs and will generate a voltage fluctuation. The EM waves will couple with each other between the signal vias and also will degrade the signal integrity.

The impedance of the signal vias 211, 214 on the PCBs 201, 202 will be different from that of the signal vias 211, 214 in the interconnection structure 203. Also, the impedance between the signal traces and the signal vias are discontinuous so there will be reflected signals. They will affect the signal quality. The ground via (or power via) 217 connects electrically to the ground planes (or power planes) on both PCBs 201, 202. The ground via (or power via) 217 will provide a very long current return path between the ground planes (or power planes) on the PCBs 201, 202 for the signal vias. The very long current return path will improve the signal integrity very little.

For the extended implement of the "Type B" via structure of the application that is entitled "A Novel Via Structure for Improving Signal Integrity," (application Ser. No. 11/651, 338), the metal frame will not be suitable because the signals cannot be shorted and go through the metal frame in the interconnection structure. However, the surrounding vias will be applicable. The signal vias will surround the ground vias (or the power vias). The novel via structure also alleviates the factors affecting the signal integrity such as via-to-via coupling, impedance discontinuity, EM radiation, and so on. The ground vias (or power vias) will provide complete voltage reference surfaces and the shortest current return paths for the signals propagating along the signal vias. Also, any EM waves generated by the signal vias will be concentrated between the ground vias (or power vias) and the signal vias so that the signal vias will couple less energy with other vias.

Again, the via structures passing through the interconnection structure can be formed by mechanical or laser drilling. The via holes are "through holes". First, the "signal through vias" are formed to connect electrically the signal layers on the PCBs. Then, the ground through vias (or power through vias) surrounding the signal through vias are formed to connect the ground layers (or the power layers) on the PCBs. The ground vias (or power vias) can be plated to form square annular tubes or filled with copper to form square solid cuboids. The material of the ground vias (or power vias) can be any conductive alloy or metal such as Tin (Sn), silver (Ag), copper (Cu), gold (Au). Any standard technique such as casting, plating, or non-plating can be adapted for the formation of any via in the embodiments of the invention.

The signal vias are plated with copper in this example. The signal vias and ground vias (or power vias) are square and concentric. However, it is not necessary that they be square annular tubes or that they be concentric. For example, the ground vias (power vias) can be cylindrical rings, solid cylinders, or polygon rings which can be concentric or not with the signal vias. Also, the signal vias must be kept at least a distance equal to the size of the anti-pad from the ground vias (or power via). There is no limit to the thickness of the ground vias since they will mainly provide reference surfaces and current return paths for the signal vias. The EM waves will be tightly concentrated between the signal vias and the ground vias (or power vias). Therefore, the via-to-via EM coupling will be reduced as well. Finally, the signal integrity will be improved.

The construction of the novel interconnection structure shown in FIGS. 1-4 can be accomplished using typical PCB fabrication techniques or connector fabrication techniques. FIGS. 25-33 show the sequential steps required for the fabrication of the metal frame of the novel interconnection structure shown in FIGS. 1-4. FIG. 34-40 show the sequential steps required for the fabrication of the surrounding via of the novel interconnection structure shown in FIGS. 1-4.

Figure 25:
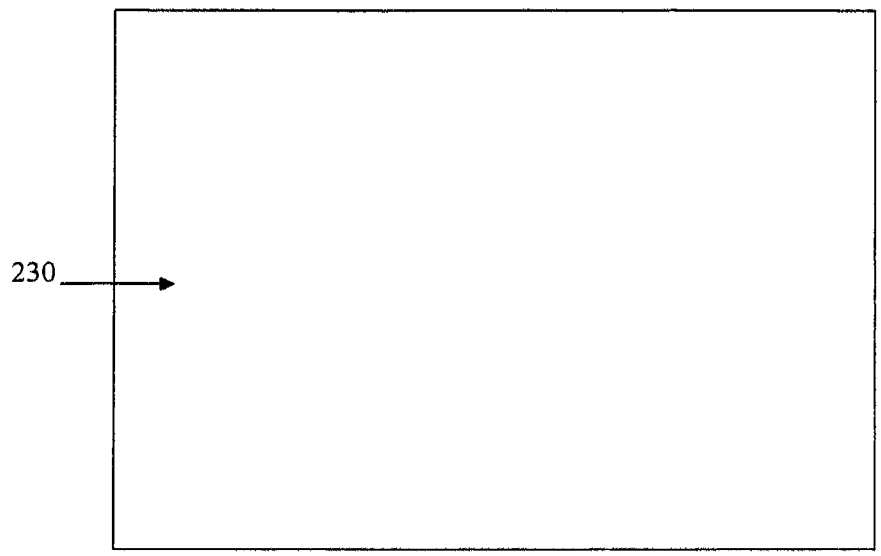
FIGS. 25-40 show the sequential fabrication steps required for the formation of the novel interconnection structure shown from FIG. 1 to FIG. 4.

FIG. 25 shows the substrate of the interconnection structure 230. The material, FR4, is commonly used as the dielectric material for PCB boards. The material, polyester, is commonly used as the dielectric material for the connector. Any proper dielectric material can be used for these printed circuit boards or connectors, including Low Temperature Co-fired Ceramic (LTCC) or Rogers Duroid™.

Figure 26:
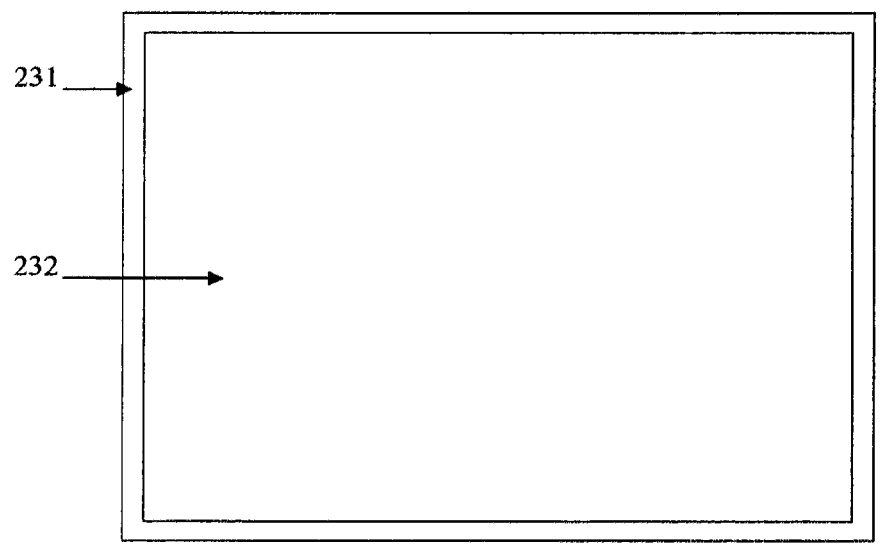

FIG. 26 shows that a through hole 232 is formed in the interconnection structure 231. Mechanical or laser drilling can be used for the construction of this through hole.

Figure 27:
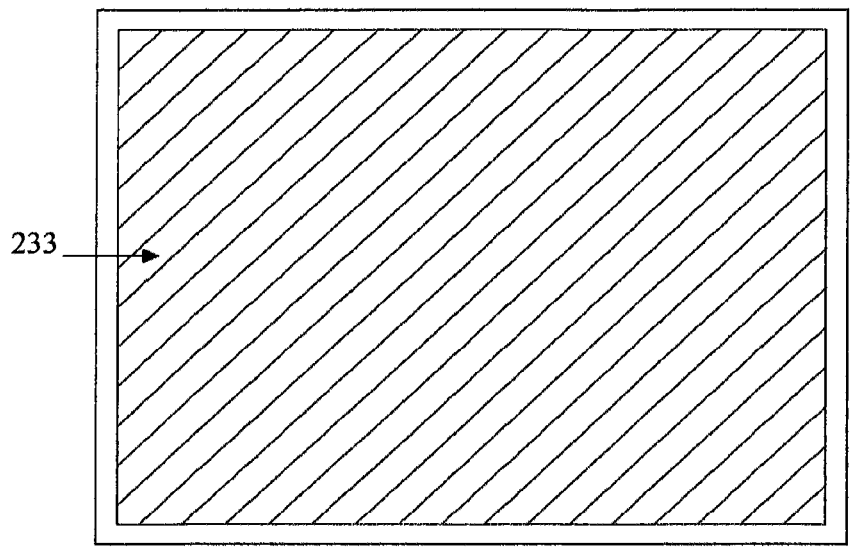

FIG. 27 shows that the through hole 232 in FIG. 26 is filled with conductive metal 233.

Figure 28:
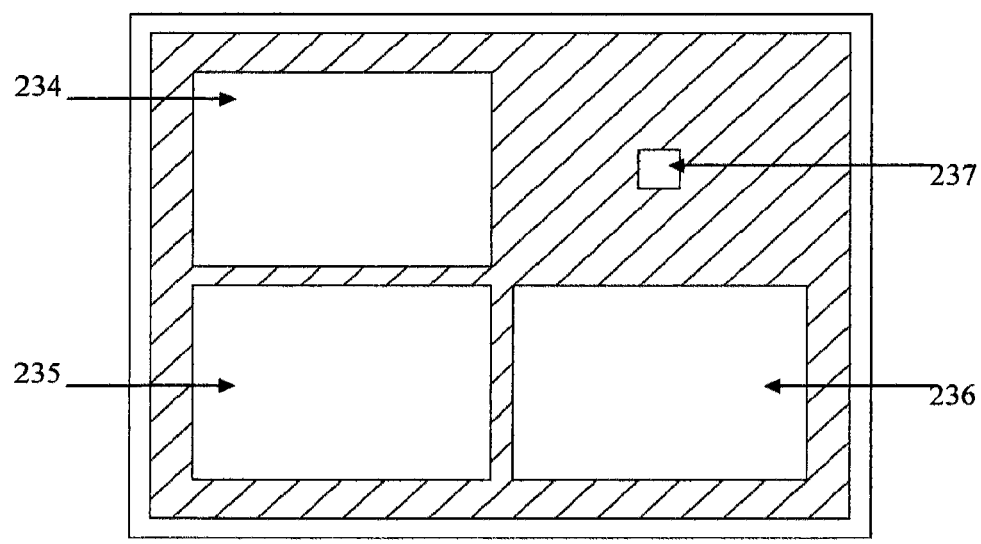

FIG. 28 shows that four through holes 234, 235, 236, 237 are drilled through the conductive metal 233 in FIG. 27.

Figure 29:
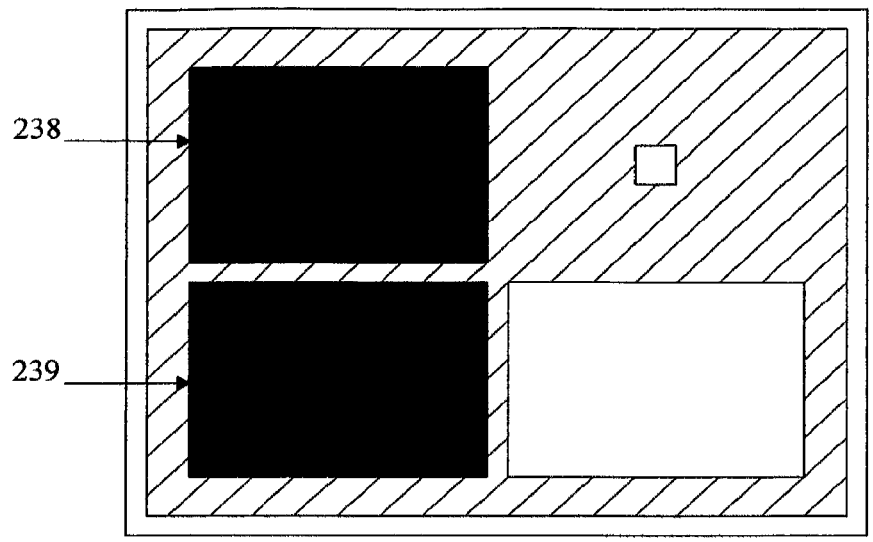

FIG. 29 shows that the two through holes 234, 235 in FIG. 28 are filled with conductive metal 238, 239.

Figure 30:
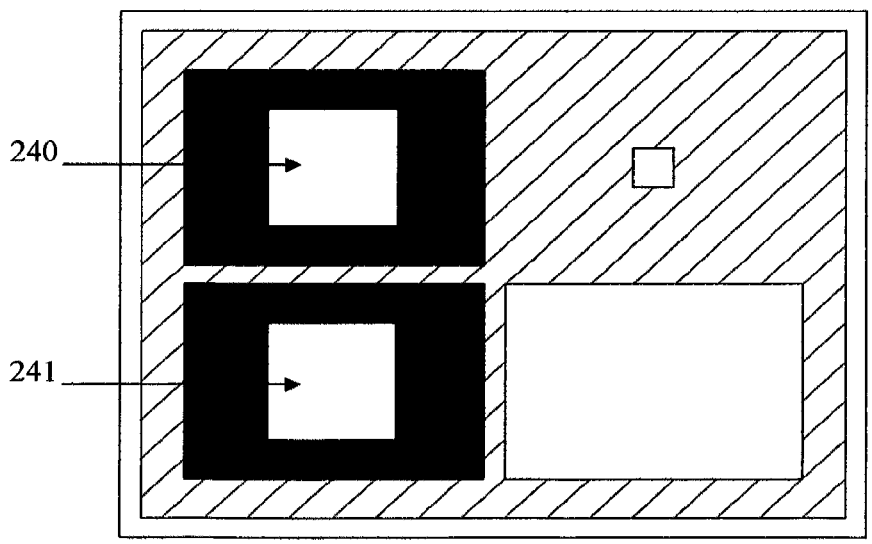

FIG. 30 shows that the two through holes 240, 241 are drilled through the conductive metal 238, 239 in FIG. 29.

Figure 31:
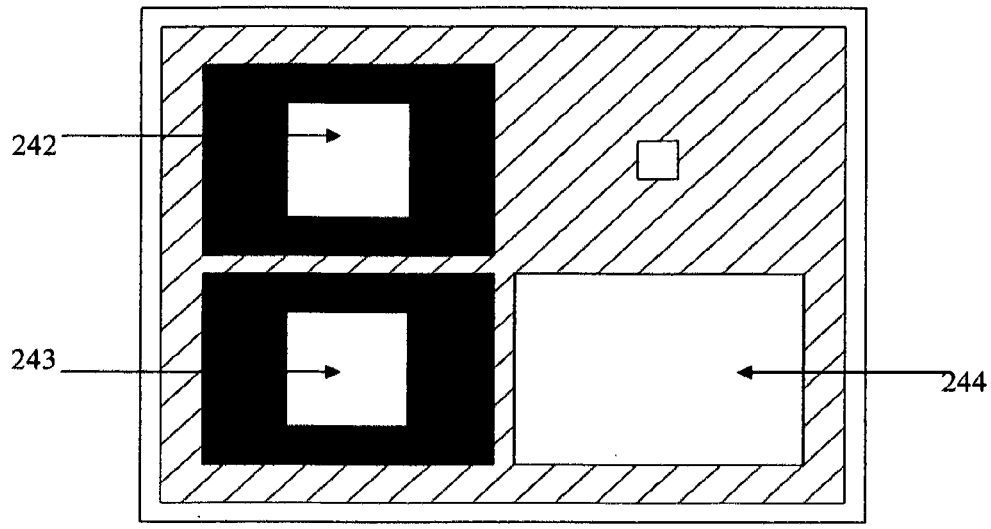

FIG. 31 shows that the three through holes 242, 243, 244 are filled with dielectric material. The dielectric material of the through holes 242, 243 can be optimally selected to control the impedance of the signal via. The dielectric material of the through holes 244 can be optimally selected to control the value of the capacitor. Chemical vapor deposition can be applied to fill the hole. Many other possible techniques can be applied as well. The details of those well-known techniques are not discussed here.

Figure 32:
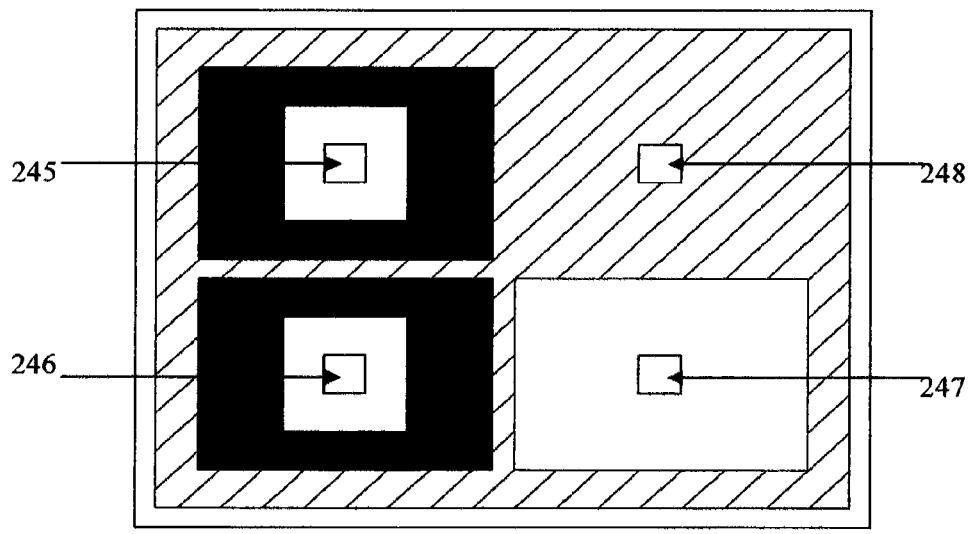

FIG. 32 shows that three through holes 245, 246, 247 are drilled through the dielectric holes 242, 243, and 244 in FIG. 31.

Figure 33:
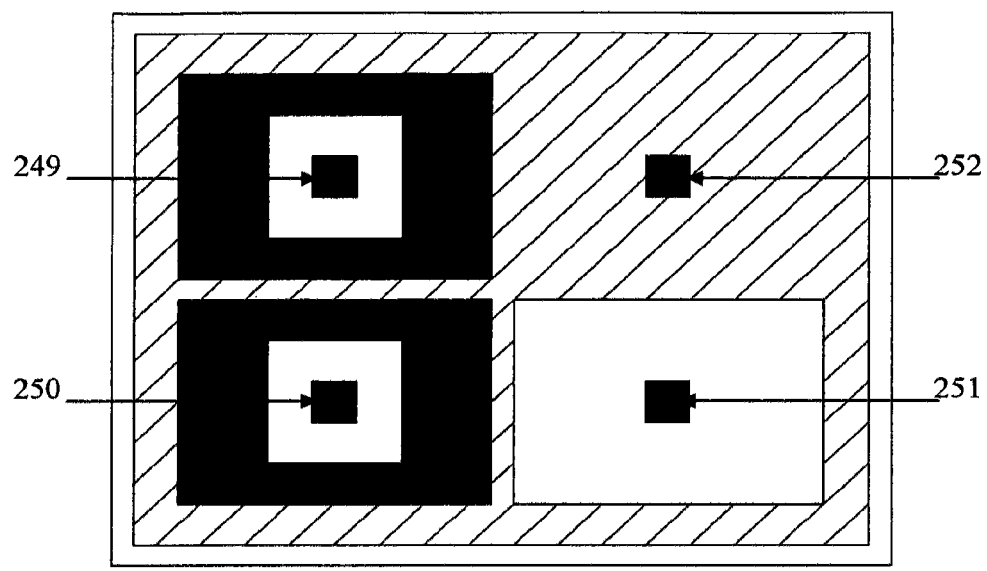

FIG. 33 shows that the four through holes 245, 246, 247, 248 in FIG. 32 are filled with conductive metal 249, 250, 251, and 252.

FIG. 34-40 show the sequential steps required for the fabrication of the surrounding via of the novel interconnection structure shown in FIGS. 1-4.

Figure 34:
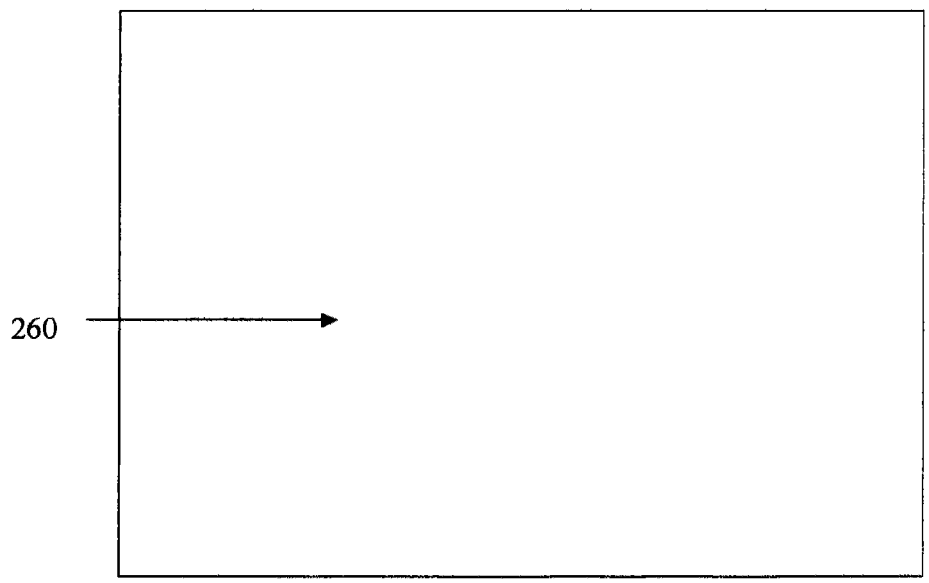

FIG. 34 shows the substrate of the interconnection structure 260. The material, FR4, is commonly used as the dielectric material for PCB boards. The material, polyester, is commonly used as the dielectric material for the connector. Any proper dielectric material can be used for these printed circuit boards or connector, including Low Temperature Co-fired Ceramic (LTCC) or Rogers Duroid™.

Figure 35:
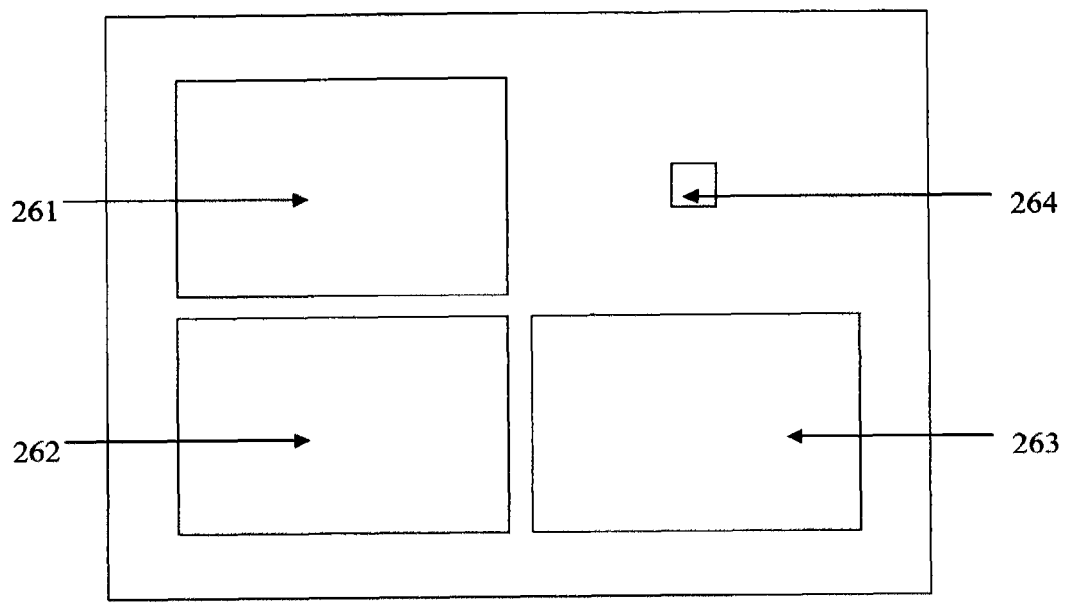

FIG. 35 shows that four through holes 261, 262, 263, 264 are drilled through the dielectric material 260 in FIG. 34. Mechanical or laser drilling can be used for the construction of the through hole.

Figure 36:
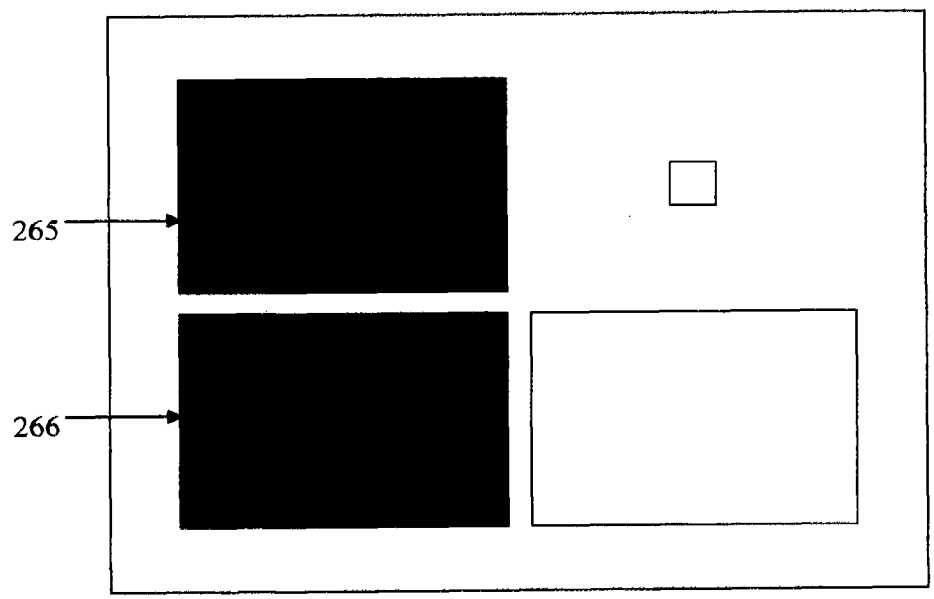

FIG. 36 shows that the two through holes 261, 262 in FIG. 35 are filled with conductive metal 265, 266.

Figure 37:
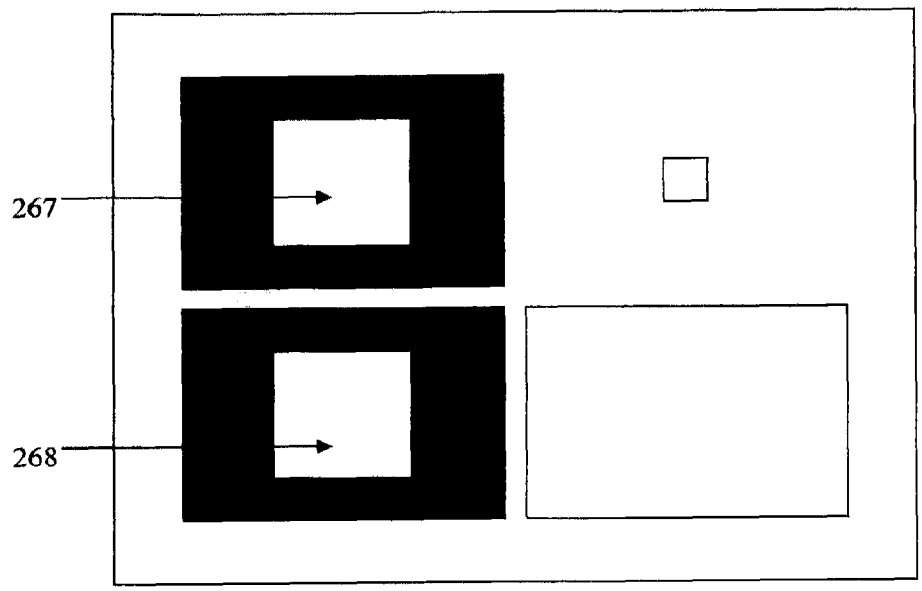

FIG. 37 shows that the two through holes 267, 268 are drilled through the conductive metal 265, 266 in FIG. 36.

Figure 38:
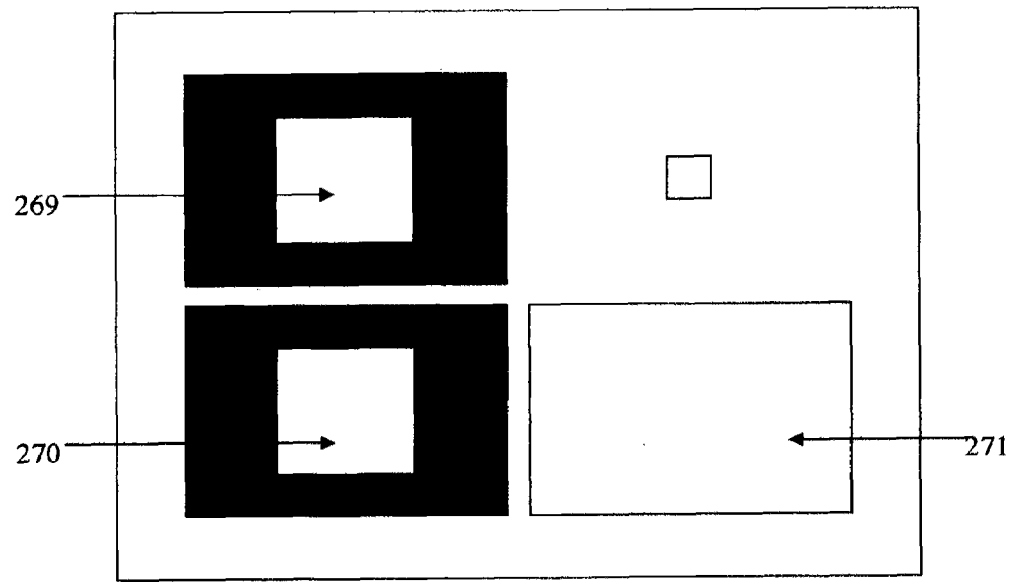

FIG. 38 shows that the three through holes 269, 270, 271 are filled with dielectric material. The dielectric material of the through holes 269, 270 can be optimally selected to control the impedance of the signal via. The dielectric material of the through holes 271 can be optimally selected to control the value of the capacitor. Chemical vapor deposition can be applied to fill the hole. Many other possible techniques can be applied as well. The details of those well-known techniques are not discussed here.

Figure 39:
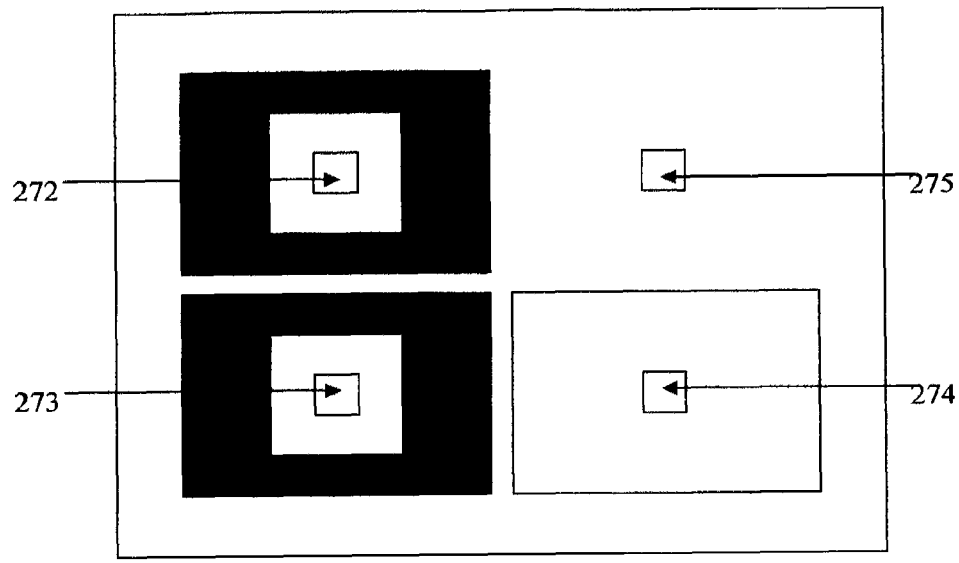

FIG. 39 shows that three through holes 272, 273, 274 are drilled through the dielectric holes 269, 270, and 271 in FIG. 38.

Figure 40:
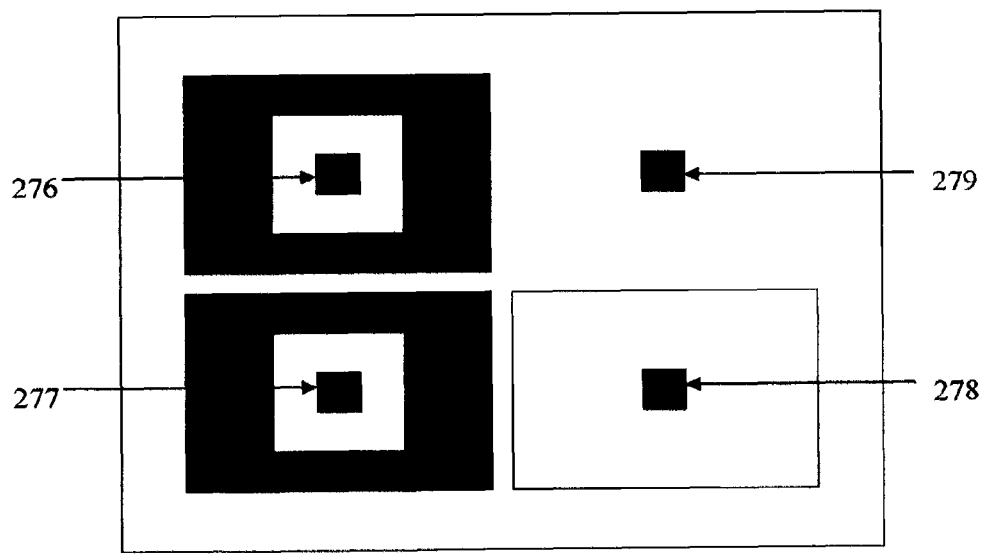

FIG. 40 shows that the four through holes 272, 273, 274, 275 in FIG. 39 are filled with conductive metal 276, 277, 278, and 279.

Figure 21:
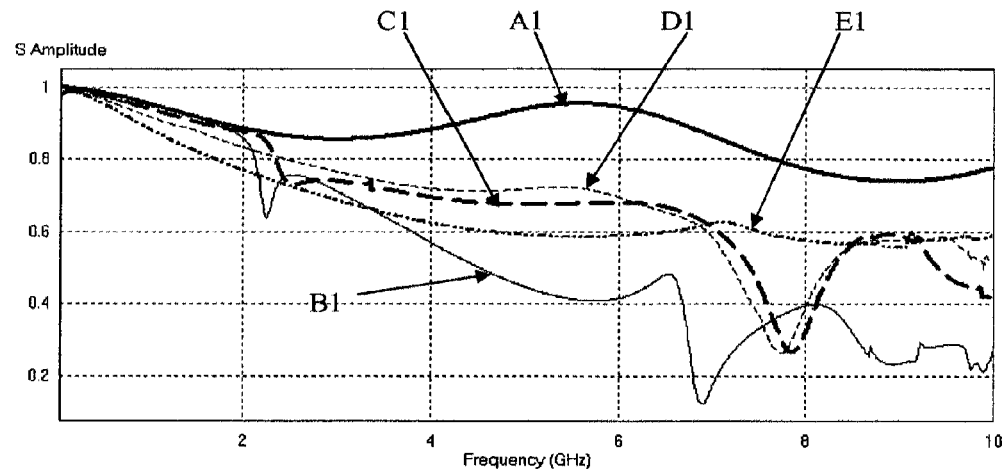
FIG. 21 and FIG. 22 show the simulated insertion losses ($S_{21}$ and $S_{43}$) of all interconnection systems. The coarse solid lines represent the magnitudes of the simulated $S_{21}$ and $S_{43}$ values predicted for the novel interconnection structure shown from FIG. 1 to FIG. 4. The other lines represent the magnitudes of the simulated $S_{21}$ and $S_{43}$ values predicted for the other prior interconnection structures shown from FIG. 5 to FIG. 20.
Figure 22:
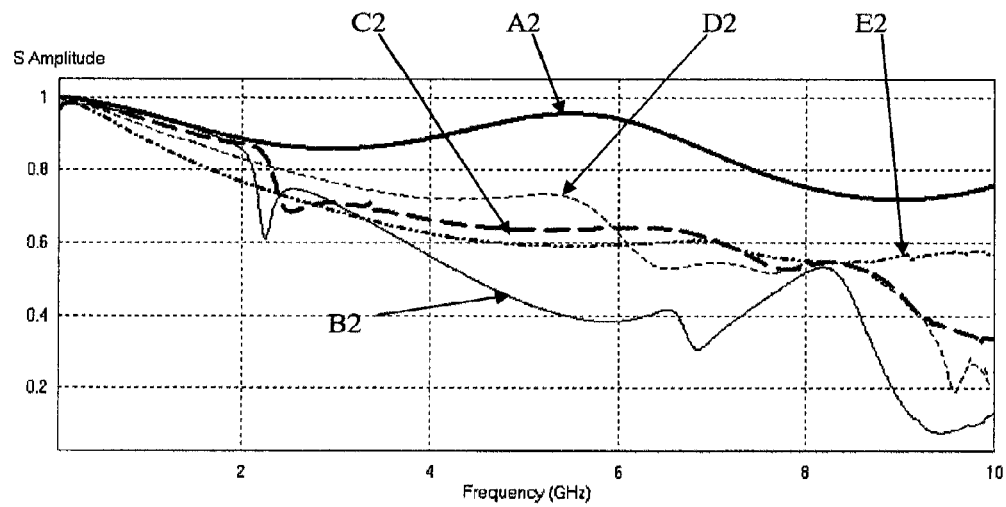

Simulations were explored with the combination of two printed circuit boards (PCBs) and an interconnection structure to confirm the performance of the novel interconnection structures that comprise the invention: a metal frame, a "Type A" via structure, and a capacitor. FIG. 21-24 are the simulation results for the combination of the PCBs and the interconnection structure. FIG. 21 and FIG. 22 show the simulated insertion losses ($S_{21}$) and ($S_{43}$) of the combination systems with the novel interconnection structure and the four prior interconnection structures, respectively. The coarse solid curves A1, A2 represent the simulated insertion losses ($S_{21}$), ($S_{43}$) of the novel interconnection structure. The thin solid curves B1, B2 represent the simulated insertion losses ($S_{21}$), ($S_{43}$) of the first prior interconnection structure. The coarse dashed curves C1, C2 represent the simulated insertion losses ($S_{21}$), ($S_{43}$) of the second prior interconnection structure. The thin dashed curves D1, D2 represent the simulated insertion losses ($S_{21}$), ($S_{43}$) of the third prior interconnection structure. The thin double dashed curves E1, E2 represent the simulated insertion losses ($S_{21}$), ($S_{43}$) of the fourth prior interconnection structure. It is clearly shown that the insertion loss ($S_{21}$), ($S_{43}$) of the novel interconnection structure is larger than that of the other prior interconnection structures. These results indicate that the signal will be transmitted more effectively when the novel interconnection structure is used. In other words, the signal integrity is improved.

Figure 23:
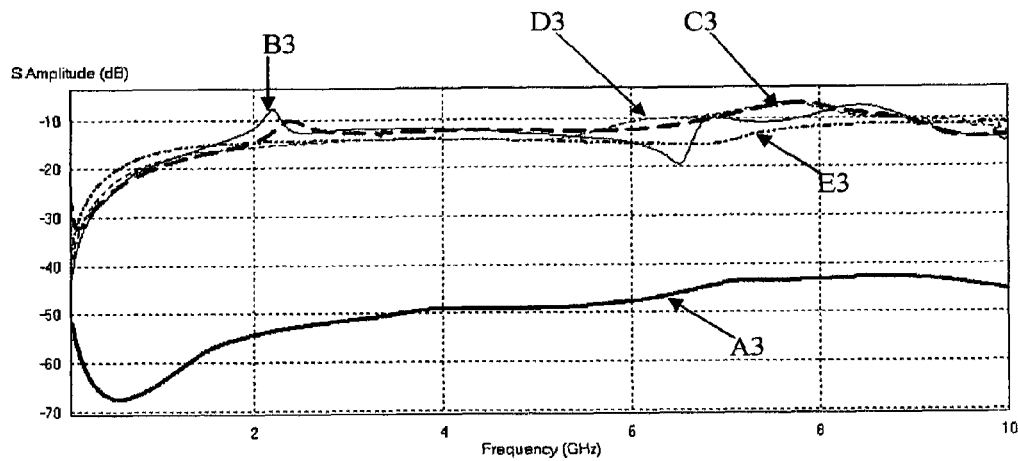
FIG. 23 and FIG. 24 show the simulated insertion losses ($S_{31}$ and $S_{42}$) of all interconnection systems. The coarse solid lines represent the magnitudes of the simulated $S_{31}$ and $S_{42}$ values predicted for the novel interconnection structure shown from FIG. 1 to FIG. 4. The other lines represent the magnitudes of the simulated $S_{31}$ and $S_{42}$ values predicted for the other prior interconnection structures shown from FIG. 5 to FIG. 20.
Figure 24:
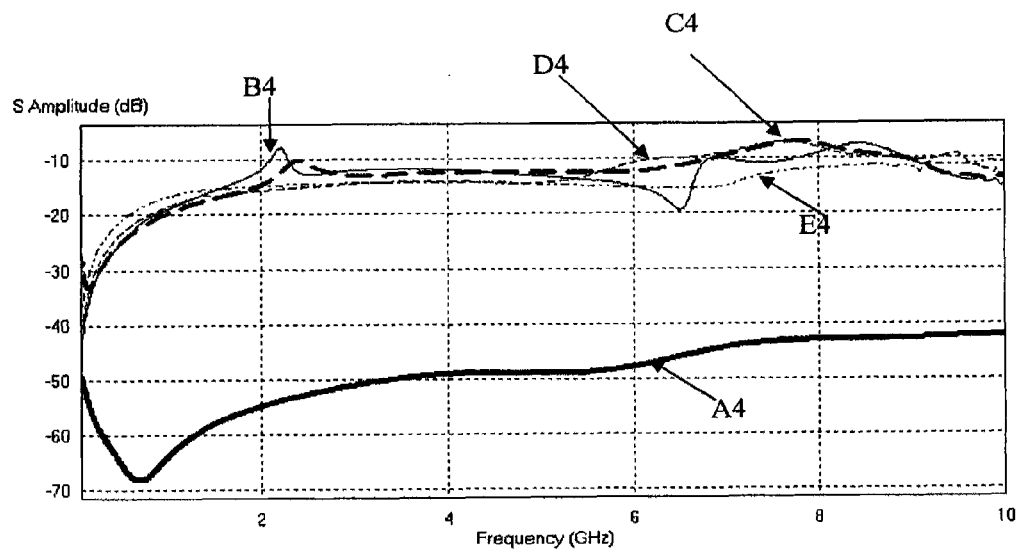

Similarly, FIG. 23 and FIG. 24 show the simulated insertion losses ($S_{31}$) and ($S_{42}$) of the combination systems with novel interconnection structure and four prior interconnection structures, respectively. The coarse solid curves A3, A4 represent the simulated insertion losses ($S_{31}$), ($S_{42}$) of the novel interconnection structure. The thin solid curves B3, B4 represent the simulated insertion losses ($S_{31}$), ($S_{42}$) of the first prior interconnection structure. The coarse dashed curves C3, C4 represent the simulated insertion losses ($S_{31}$), ($S_{42}$) of the second prior interconnection structure. The thin dashed curves D3, D4 represent the simulated insertion losses ($S_{31}$), ($S_{42}$) of the third prior interconnection structure. The thin double dashed curves E3, E4 represent the simulated insertion losses ($S_{31}$), ($S_{42}$) of the fourth prior interconnection structure. It is clearly shown that the insertion losses ($S_{31}$), ($S_{42}$) of the novel interconnection structure are smaller than that of the other prior interconnection structures. These results indicate that there will be less energy coupling between port 1 and port 3 when the novel interconnection structure is used. In other words, the signal integrity is improved.

The embodiments of the invention comprise the metal frame structures and the novel via structures "Type A", "Type B", and "Type C". These novel structures have the same method of fabrication. The metal frame and the surrounding ground vias (or power vias) ("Type A" via structure) will connect the ground planes (or the power planes) on the PCBs. The connection of any two or above surrounding via structures ("Type A" via structure) will form a metal frame. It provides the shortest current return path and reduces the impedance discontinuity. Also, the EM field will be concentrated between the signal via and power via (or ground via) and, consequently, the signal via will couple less energy with any other via. As a result, the signal integrity will be improved. For the "Type B" via structure, it is based on the same concept of the application that is entitled "A Novel Via Structure for Improving Signal Integrity," (application Ser. No. 11/651,338). As a result, the details are not discussed here. For the "Type C" via structure, the capacitor or interdigitated capacitor will be properly designed to benefit to the signal integrity of the whole system.

In short, the inventive concepts unveiled herein are the basic examples and can be modified. Any modification based any extension of the inventive concepts fall within the scope of the appended claims and their equivalents; and consequently, they should be covered by this patent.

What is claimed is:

1. A via structure in an interconnection structure for switching signals between circuit boards, from top to bottom comprising:
    a first power or ground layer in a first layer;
    a first medium in a second layer;
    a first signal layer in a third layer;
    a second medium in a fourth layer;
    a second signal layer in a fifth layer;
    a third medium in a sixth layer;
    a second power or ground layer in a seventh layer;
    a power or ground via passing through the first medium, the first signal layer, the second medium, the second signal layer and the third medium, and connecting the first power or ground layer to the second power or ground layer;
    a signal via passing through the second medium around the power or ground via, and connecting the first signal layer to the second signal layer;
    an anti-pad being located between the power or ground via and the signal via;
    wherein when the signals propagating through a path from the first signal layer through the signal via to the second signal layer in the interconnection structure, the signals propagate through the path with complete impedance continuity.

2. The via structure of claim 1, wherein the first power or ground layer in the first layer and the second power or ground layer in the seventh layer have same electrical characteristics.

3. The via structure of claim 1, wherein the first power or ground layer and the second power or ground layer are deformed to power grids or ground grids on a die.

4. The via structure of claim 1, wherein the power or ground via is concentric to the signal via.

5. The via structure of claim 1, wherein the interconnection structure is incorporated into a connector, a printed circuit board, an integrated circuit package or any form of integrated circuit.

6. The via structure of claim 1, wherein the power or ground via and the signal via of the interconnection structure are connected electrically with those of any other integrated circuit board to improve the signal integrity of the combined system.

7. A via structure in a multi-layer interconnection structure for switching signals between circuit boards, comprising:
    a power or ground via that goes through a first power or ground layer, a first medium, a first signal layer, a second medium, a second signal layer, a third medium and a second power or ground layer from top to bottom along a same axis, and connects the first power or ground layer to the second power or ground layer; and
    a signal via passing through the second medium around the power or ground via, and connecting the first signal layer to the second signal layer,
    wherein when the signals propagating through a path from the first signal layer through the signal via to the second signal layer in the multi-layer interconnection structure, the signals propagate through the path with complete impedance continuity.

8. The via structure of claim 7, wherein the power or ground via is concentric with the signal via.

9. The via structure of claim 7, wherein the power or ground via and the signal via are circular, square, rectangular, or of any shape.

10. The via structure of claim 7, wherein the distance between the power or ground via and the signal via is properly designed to control the impedance of the signal via.

11. The via structure of claim 7, the dielectric material between the power or ground via and the signal via is properly selected to control the impedance of the signal via.

12. The via structure of claim 7, wherein the power or ground via and the signal via are perpendicular to electrical layers of the circuit boards.

13. The via structure of claim 7, wherein the power or ground via and the signal via are located in the dielectric.

14. The via structure of claim 7, wherein the power or ground via and the signal via of the multi-layer interconnection structure are connected electrically with those of any other integrated circuit board to improve the signal integrity of the combined system.

* * * * *